(12) United States Patent
Nakamura

(10) Patent No.: US 8,896,587 B2
(45) Date of Patent: Nov. 25, 2014

(54) SURFACE-EMITTING DISPLAY DEVICE

(75) Inventor: Hideyo Nakamura, Matsumoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 834 days.

(21) Appl. No.: 12/935,572

(22) PCT Filed: Mar. 26, 2009

(86) PCT No.: PCT/JP2009/056068
§ 371 (c)(1),
(2), (4) Date: Dec. 22, 2010

(87) PCT Pub. No.: WO2009/122998
PCT Pub. Date: Oct. 8, 2009

(65) Prior Publication Data
US 2011/0109611 A1    May 12, 2011

(30) Foreign Application Priority Data
Mar. 31, 2008 (JP) .................. 2008-091033

(51) Int. Cl.
| G06F 3/038 | (2013.01) |
| H01L 27/32 | (2006.01) |
| G09G 3/20 | (2006.01) |
| G09G 3/32 | (2006.01) |

(52) U.S. Cl.
CPC .............. *H01L 27/3279* (2013.01); *G09G 3/20* (2013.01); *G09G 3/3225* (2013.01); *G09G 2300/0426* (2013.01); *G09G 2300/0439* (2013.01); *G09G 2320/0223* (2013.01); *G09G 2330/02* (2013.01); *H01L 2251/5315* (2013.01)

USPC ........................................... 345/212

(58) Field of Classification Search
CPC .............. G09G 2300/0426; G09G 2300/0439; G09G 3/20; G09G 3/3225; H01L 2251/5315; H01L 27/3279; H01L 21/76829; H01L 21/76838; H01L 29/458; H01L 29/66575
USPC .................. 345/204, 690, 211; 315/169.3
See application file for complete search history.

(56) References Cited

U.S. PATENT DOCUMENTS

| 3,864,545 A * | 2/1975 | Schafer et al. ............... 219/203 |
| 6,285,917 B1 * | 9/2001 | Sekiguchi et al. ............. 700/239 |
| 7,190,122 B2 * | 3/2007 | Winters et al. ............. 315/169.1 |
| 7,227,519 B1 | 6/2007 | Kawase et al. |
| 2002/0081905 A1 * | 6/2002 | Nakamura et al. ............ 439/621 |
| 2003/0001171 A1 * | 1/2003 | Banno et al. .................. 257/207 |
| 2003/0076046 A1 * | 4/2003 | Komiya et al. ............. 315/169.3 |
| 2004/0012058 A1 | 1/2004 | Aoki |

(Continued)

FOREIGN PATENT DOCUMENTS

| JP | 2001-100654 A | 4/2001 |
| JP | 2001-350442 A | 12/2001 |

(Continued)

*Primary Examiner* — Quan-Zhen Wang
*Assistant Examiner* — Chun-Nan Lin
(74) *Attorney, Agent, or Firm* — Rabin & Berdo, P.C.

(57) ABSTRACT

This invention provides a surface-emitting display device comprising a plurality of power supply lines 21 connected to a plurality of pixel circuits, respectively, and a power supply bus 22 having a power supply terminal 23 and connected to end portions of the plurality of power supply lines 21 at a prescribed interval, the power supply bus 22 having one or more slits 71, 72 extending along the length direction thereof from the power supply terminal 23 toward the end portions.

17 Claims, 21 Drawing Sheets

(56) References Cited

U.S. PATENT DOCUMENTS

| | | |
|---|---|---|
| 2004/0108977 A1* | 6/2004 | Hirayama .................... 345/76 |
| 2005/0057461 A1* | 3/2005 | Suh et al. .................... 345/76 |
| 2005/0088103 A1* | 4/2005 | Kageyama et al. ........ 315/169.3 |
| 2005/0117105 A1* | 6/2005 | Kang et al. .................. 349/143 |
| 2005/0117410 A1* | 6/2005 | Shin ...................... 365/189.09 |
| 2005/0140306 A1* | 6/2005 | Park ........................ 315/169.3 |
| 2005/0184927 A1* | 8/2005 | Kwak ............................ 345/45 |
| 2005/0258771 A1* | 11/2005 | Kang et al. ................ 315/169.1 |
| 2006/0077144 A1* | 4/2006 | Eom et al. ..................... 345/82 |
| 2006/0097971 A1* | 5/2006 | Lee et al. ...................... 345/89 |
| 2006/0132055 A1* | 6/2006 | Kwak ........................ 315/169.3 |
| 2006/0209058 A1* | 9/2006 | Nakamura et al. ............ 345/211 |
| 2006/0244741 A1* | 11/2006 | Kimura et al. ................ 345/204 |
| 2006/0284803 A1* | 12/2006 | Ikeda ............................ 345/76 |
| 2007/0132673 A1* | 6/2007 | Jinno et al. .................... 345/76 |
| 2007/0200842 A1* | 8/2007 | Tokuda et al. ................ 345/204 |
| 2008/0130210 A1* | 6/2008 | Komori ......................... 361/681 |
| 2008/0203577 A1* | 8/2008 | Fukamizu et al. ............ 257/773 |
| 2008/0266228 A1* | 10/2008 | Ueno ............................. 345/89 |
| 2009/0079722 A1* | 3/2009 | Onozawa et al. ............. 345/212 |
| 2009/0135104 A1* | 5/2009 | Jeong ............................. 345/76 |
| 2009/0167731 A1* | 7/2009 | Ito ................................. 345/204 |
| 2009/0207150 A1* | 8/2009 | Obi et al. ....................... 345/174 |
| 2009/0213148 A1* | 8/2009 | Takasugi ....................... 345/690 |
| 2009/0219263 A1* | 9/2009 | Shino et al. .................... 345/204 |
| 2009/0278827 A1* | 11/2009 | Yokoyama .................... 345/204 |
| 2010/0066714 A1* | 3/2010 | Ozaki ............................ 345/207 |

FOREIGN PATENT DOCUMENTS

| | | | |
|---|---|---|---|
| JP | 2004-062160 A | 2/2004 | |
| JP | 2004-206055 A | 7/2004 | |
| JP | 2005-078071 A | 3/2005 | |
| JP | 2005-157300 A | 6/2005 | |
| JP | 2005-157341 A | 6/2005 | |
| JP | 2005-196167 A | 7/2005 | |
| JP | 2005-331919 A | 12/2005 | |
| JP | 2006-113587 A | 4/2006 | |
| JP | 2006-163384 A | 6/2006 | |
| JP | 2007-034278 A | 2/2007 | |
| JP | 2007-232795 A | 9/2007 | |
| JP | 2007-232796 A | 9/2007 | |
| JP | 2007-250553 A | 9/2007 | |
| WO | WO 2009122998 A1 * | 10/2009 | ............ H01L 27/32 |

* cited by examiner

SURFACE-EMITTING DISPLAY DEVICE

TECHNICAL FIELD

This invention relates primarily to organic EL panels, liquid crystal panels, and other thin-type displays.

BACKGROUND ART

Taking a top-emission structure active matrix organic EL display as an example, a representative panel unit is formed by bonding together a TFT circuit substrate 11 on which is formed an organic EL element, and a color filter substrate 12, as shown in FIG. 1.

FIG. 2(a) is a schematic diagram of the wiring configuration of this TFT circuit substrate. In this TFT circuit substrate, there exist power supply lines 21 supplying a power supply (electric power) to the individual pixel circuits 24 arranged in one column, and a power supply bus 22 which combines all of these and leads them to a power supply terminal 23. Further, resin is provided to planarize the TFT depressions/protrusions, and normally contact holes 27 connecting emission portions are provided here. The numeral 25 denotes a data signal line, and the numeral 26 denotes a gate signal line.

FIG. 2(b) is a schematic diagram which extracts only this power supply-related wiring. In this way, a configuration of the power supply lines on the TFT circuit substrate in which lines run in one direction is used, rather than full-coverage wiring or a mesh shape. One objective of this is to prevent an increase in the capacitance between wires, and consequent slower driving, due to the increase in area of power supply lines traversing signal lines. A further aim, when pixels are small, is to increase the transistor area by even a small amount. The numeral 16 denotes the position of IC (control circuit) arrangement.

FIG. 3A shows a representative configuration of a pixel circuit. This is a TFT circuit used mainly with liquid crystal elements, but can of course also be used to drive organic EL elements. In this case the TFT-side power supply line is a cathode, and the common upper transparent electrode for all the pixels is a positive electrode. The numeral 31 denotes an organic EL element, 32 and 33 denote TFTs, 34 denotes a capacitor, 35 denotes a source signal line, and 36 denotes a gate signal line.

FIG. 3B is a schematic diagram showing one example of the wiring structure of a pixel circuit 24 of a conventional TFT circuit substrate. Here, the wiring structure is shown for the principle transistor forming the pixel circuit 24 of the conventional TFT circuit substrate.

In the wiring structure of FIG. 3B, a gate wiring pattern 55 is formed as a first-layer metal wiring pattern, and moreover a source wiring pattern 56, drain wiring pattern 57, and the power supply line 21 are each formed on the gate wiring pattern 55, with an insulating layer and a Si layer 29 interposed, as a second-layer metal wiring pattern.

A gate control element region 58 is provided adjacent to the gate wiring pattern 55. This gate control element region 58 is provided with the TFT (Thin Film Transistor) 33 and capacitor 34 shown in FIG. 3A, and moreover the data signal line (source signal line) 25 which is the second-layer metal wiring pattern, and the scan signal line (gate signal line) 26 which is the first-layer metal wiring pattern, are connected.

The source wiring pattern 56 is provided as wiring forming the source of the TFT 32 shown in FIG. 3A. The base portion of this source wiring pattern 56 is connected to the power supply line 21, and the tip portion is branched into a comb shape, to form branch portions 56a, 56b parallel to the power supply line 21.

On the other hand, the drain wiring pattern 57 is provided as wiring forming the drain of the TFT 32. The base portion of this drain wiring pattern 57 is connected to the light emission portion via the contact hole 27, and has a branch portion 57a extending from this base portion to between the branch portions 56a, 56b of the source wiring pattern 56, and a branch portion 57b extending from the base portion to between the branch portion 56b and the power supply line 21. That is, the drain wiring pattern 57 has comb-shape branch portions which mesh with the comb-shape branch portions of the source wiring pattern 56.

Next, a pixel portion of the panel of FIG. 1 has cross-sectional structures along lines AA and BB in FIG. 4A(a) such as shown for example in FIG. 4B(b) and FIG. 4C(c). First, on a glass substrate there exist a TFT structure and the planarization resin 40 for this. This may be covered with an inorganic passivation film as necessary. After depositing an underlayer 41 thereupon to improve closeness of contact, a reflective electrode 42 is formed. After forming an insulating film 43 having openings at emission portions, a plurality of organic films 44 are evaporation-deposited, and a transparent electrode layer 45 is deposited thereupon. Here, what is called the upper transparent electrode layer may be IZO, ITO, or another transparent oxide layer, or may be a half-mirror shape metal film of several nm to several tens of nm. This transparent electrode layer 45 is for example as shown in FIG. 5A(a) and FIG. 5B(b), and the full-coverage wiring 53 which is common to all pixels is connected at a panel peripheral portion to a power supply bus 51 separate from that above, and is drawn out to the terminal 52. And finally, the entire face of the pixel portion is covered by a barrier layer 46.

On the other hand, on the color filter substrate side, a black matrix 47, color filter 48, and also, if necessary, a bank barrier wall 39 and color conversion layer 49, are formed on a glass substrate. Of course, there are also methods in which a bank barrier wall and color conversion layer are not used. Also, spacers 50 may be provided as necessary.

And, the TFT circuit substrate and color filter substrate are positioned such that pixels are aligned, and are bonded together. In general, an adhesive or other solid is used as a gap layer, but a liquid or gas may be used.

On a TFT circuit substrate such as that of FIG. 2, thick-film wiring such as on a printed substrate is difficult, and so the wiring resistance cannot be ignored, and the voltage drop (rise) increases in moving away from the power supply terminal. In particular, in the case of a current driving method of self-emission such as an organic EL panel, the current flowing in the power supply lines is greater than for liquid crystal panels and similar, and the voltage drop (rise) at the power supply lines and power supply bus is greater. This leads directly to an in-plane distribution of the voltages across organic EL emission elements, resulting in brightness unevenness. Further, when a TFT pixel circuit is configured as in FIG. 3A, when the GND potential in particular rises, the gate control voltage fluctuates, and so extremely large brightness unevenness results even for a slight in-plane potential distribution. Further, in the case of a current driving method of self-emission such as an organic EL panel, the current flowing in power supply lines is greater than in liquid crystal panels and similar, so that the voltage drop (rise) at power supply lines and the power supply bus is greater. Hence only a small number of pixels near the power supply terminal where the GND potential is low are very bright, and if this is left unresolved and the average brightness for the overall panel is set, even screen burn-in may occur.

There have been various proposals, as follows, of methods to reduce brightness unevenness due to such potential unevenness near power supply wiring. Patent Reference 1, Patent Reference 2, and Patent Reference 3 attempt to reduce the wiring resistance (voltage drop) due to the power supply bus by supplying power to two or more places of the power supply bus itself. This is effective for reducing resistance. However, there are cases in which power cannot be supplied to a plurality of places due to problems of space and cost, and moreover if the screen is large and the current increases, the power supply bus cannot be made sufficiently thick, and in some cases, increasing the number of places of power supply to some extent does not adequately suppress the voltage drop of the power supply bus.

Further, in Patent Reference 4, Patent Reference 5, and Patent Reference 6 and similar, attempts are made to render uniform the potential on organic EL elements through contact hole wiring measures, and these are effective in cases in which potential unevenness on organic EL elements at the center of brightness unevenness is dominant. However, when using this method, no matter how the contact resistance is adjusted, the entire current is added to the common power supply bus and flows to the power supply terminal, so that a voltage drop always occurs across the power supply bus itself at a distance place from the terminal. That is, when applying this method, the distribution of the voltage drop of the power supply bus itself cannot be reduced, so that brightness unevenness caused by unevenness in the gate voltages of TFTs such as that of FIG. 3A cannot be reduced.

Patent Reference 7 discloses the reduction of variation in the potential of power supply lines by inserting one slit up to an intermediate position of the power supply bus. However, this one slit alone cannot adequately render potentials of power supply lines uniform when the number of power supply lines connected to the power supply bus is large or when the bus is long.

Patent Reference 8 discloses a substrate for displays which reduces voltage drops by connecting adjacent power supply lines (Vdd) at a plurality of places using metal lines. Here, reduction of the widths of the portions of intersection of metal lines and data lines to reduce parasitic capacitance is also described. However, in this configuration, power supply lines are simple connected in a mesh shape, so that for example during full-surface lighting, voltage drops are reduced prominently only near the power supply terminal, and concentrated brightness unevenness results.

It is also possible to correct the light emission instruction data itself sent to each pixel, to reduce brightness unevenness by software means. However, brightness unevenness in a screen is two-dimensional, and it would be necessary to provide memory sufficient for all pixels in the image controller and also set two-dimensional correction coefficients, entailing prohibitive costs.

Of course, power supply line materials can be changed to lower-resistance wiring materials, power supply line films can be made thicker, and bus widths can be expanded to lower power supply line resistances. However, a change in wiring material would necessitate changes in conventional processes, and thickening of power supply line films would cause cost increases and increases in internal stresses (warping, cracking, film peeling). Further, an increases in the bus width would cause an increase in the frame, and would further cause a cost increase due to the reduced product yield from the mother substrate.

Patent Reference 1: Japanese Patent Application Laid-open No. 2007-232795
Patent Reference 2: Japanese Patent Application Laid-open No. 2007-232796
Patent Reference 3: Japanese Patent Application Laid-open No. 2004-206055
Patent Reference 4: Japanese Patent Application Laid-open No. 2005-078071
Patent Reference 5: Japanese Patent Application Laid-open No. 2005-157300
Patent Reference 6: Japanese Patent Application Laid-open No. 2007-250553
Patent Reference 7: Japanese Patent Application Laid-open No. 2007-34278
Patent Reference 8: Japanese Patent Application Laid-open No. 2006-163384

DISCLOSURE OF THE INVENTION

Hence an object of this invention is to inexpensively provide a surface-emitting display device, such as an organic EL display or similar, which has little brightness unevenness, even in cases in which there is a limit to resistance reduction by modification of the process, material, line width, or film thickness for power supply wiring.

In order to attain the above object, in a power supply bus to which are connected a plurality of power supply lines which provide power supplies to a plurality of pixels and in a circuit substrate (including a simple wiring board) having a power supply terminal connected thereto of this invention, a slit-shape hole is provided in the power supply bus. And, the widths and lengths of each of the portions of the power supply bus divided by the slit are adjusted such that the voltage drops (rises) in the power supply lines and bus connection portions during full-surface lighting are substantially uniform in all power supply lines. That is, the widths of sites divided by a split in the power supply bus are narrower when power is supplied mainly to power supply lines close to the terminal, and thicker when power is supplied mainly to distant power supply lines. And, in the vicinity of a power supply line connection portion, measures are taken such that the power supply bus is entirely connected. The number of divisions by slits may be determined as appropriate according to the specifications of unevenness adjustment. When it is necessary to eliminate the brightness unevenness which nonetheless remains, very small memory, equivalent to the number of scan lines or to the number of data lines, is placed in the image controller control circuit, and one-dimensional distribution correction is performed.

More specifically, this invention provides a surface-emitting display device, comprising:

a plurality of power supply lines connected to a plurality of pixel circuits, respectively; and a power supply bus having a power supply terminal, and connected to end portions of the plurality of power supply lines at a prescribed interval, wherein the power supply bus has one or more slits (or cutout portions) extending along the length direction thereof from the power supply terminal toward the end portions.

Here, in the above surface-emitting display device, a mode is preferable in which the power supply bus is divided by the slits, and potentials at the end portions are adjusted to desired values in accordance with the number of slits and/or the widths and lengths of power supply bus portions obtained by division by the slits. Here, it is preferable that all or a portion of the slits have a shape with a closed perimeter within the power supply bus.

And, in the above surface-emitting display device, a mode is preferable in which a control circuit is further provided to correct current instruction values supplied to the pixel circuits arranged in a direction perpendicular to the power supply lines, according to the distances from connection portions of the pixel circuits and the power supply lines to the end portions of the power supply bus.

Further, in the above surface-emitting display device, a mode is preferable in which both end portions of the power supply lines are connected to the power supply bus, and the power supply bus of both end portions of the power supply lines have one or more independent slits.

Also, in the above surface-emitting display device, a mode is preferable in which a portion or all of the power supply bus is formed by a plurality of layers in which materials of different types or materials of the same type are layered.

In addition, the pixel circuits may cause emission of or drive organic EL elements.

Further, this invention also provides a method of adjusting brightness unevenness in a surface-emitting display device. Specifically, a method of adjusting brightness unevenness in a surface-emitting display device is provided, which includes a step of providing a power supply bus, having one or more slits extending along the length direction thereof, and also having a power supply terminal;

a step of providing a plurality of power supply lines connected to a plurality of pixel circuits, respectively, and connecting end portions of the power supply lines to the power supply bus at a prescribed interval; and a step of correcting, using a control circuit, current instruction values supplied to the pixel circuits arranged in a direction perpendicular to the direction of extension of the power supply lines, according to the distances from connection portions of the pixel circuits and the power supply lines to the end portions.

Here, a mode is preferable in which the control circuit performs processing of multiplying the current instruction values by correction coefficients according to the distances.

Further, this invention also proposes a surface-emitting display device, comprising:

a plurality of power supply lines connected to a plurality of pixel circuits, respectively;

a connection line connecting together power supply lines adjacent on at least one side, of the power supply lines; and a power supply bus having a power supply terminal, and connected to end portions of the plurality of power supply lines at a prescribed interval, wherein the power supply bus has one or more slits extending along the length direction thereof from the power supply terminal toward the end portions.

Here, it is preferable that the connection line not be connected to the power supply bus in the direction of extension thereof.

A mode may be employed such that the above connection line interconnects a plurality of the power supply lines allocated to one set forming a certain pixel column, and are not connected to power supply lines allocated to another set forming another pixel column. Here, the above one set and other set can include a plurality of power supply lines connected to a subpixel column forming one pixel column. Subpixels forming such a single pixel column are normally formed from approximately two to four colors, and are not limited to the red, green, and blue colors shown in examples, but may also include white and intermediate colors.

Further, a mode may be employed in which a portion of wiring forming a thin film transistor included in the above pixel circuit forms a bypass line path with respect to the power supply line connected to an internal line path of each of the pixel circuits. Here, a mode may be employed in which a portion of the bypass line path and a portion of the above connection line are formed from common wiring.

The traversal of a control line by a connection line of power supply lies may increase parasitic capacitance, so that transistor operation may be slowed. In such cases, there is no need to connect together power supply lines at all pixels, and the connection positions and number of connections and thicknesses, and similar, may be adjusted appropriately.

Action

In a power supply bus structure using a slit of this invention, during full-surface lighting, voltage drops (rises) at connection portions of power supply lines and the power supply bus are substantially uniform for all power supply lines, so that brightness unevenness is reduced. This is because not only the potential distribution on the organic EL emission layer, but also the distribution of TFT gate potentials is reduced. And, the remaining brightness unevenness is only one-dimensional, in the direction of extension of the power supply lines. When this poses a problem, correction is performed by the image controller, but the same correction coefficients can be set for pixel columns arranged perpendicularly to the direction of extension of the power supply lines, so that simple one-dimensional distribution correction may be performed using very small memory. By these means, brightness unevenness during full-surface lighting can be almost completely eliminated.

Also, by further adding the above connection line to a surface-emitting display device including the above slit, for example even in a case in which the current balance of different colors (for example, red, green and blue, or similar) is greatly different during full-surface lighting of a color panel, current can be distributed from power supply lines in which large currents flow to the side of power supply lines in which only small currents flow. Consequently voltage drops of power supply lines would be averaged, and power consumption and brightness unevenness could be reduced. The reason for this is that, when there is no connection line, even when the total current (average current) is the same, the overall power supply voltage would have to be raised according to the voltage drops of power supply lines for a specific color which pass the largest currents. And, if the voltage drops of the power supply lines for each of the colors red, green, blue, and similar were prominently different, then brightness unevenness would be different for each color, and separate brightness unevenness correction for each color would become necessary. Here, by configuring the above connection line which connects together power supply lines so as not to connect to the power supply bus in the direction of extension thereof (in order that current flows in the direction of the power supply bus in which a slit exists), the slit effect is maintained, and the potentials at each of the connection portions of the power supply lines and power supply bus become equal.

And, by further adding the above bypass line path to a surface-emitting display device including the above slit and connection line, the wiring resistance of power supply lines can itself be reduced, and the voltages applied to the emission element of each pixel circuit connected to each of the power supply lines can be made uniform within the circuit substrate. Consequently, the overall brightness unevenness can be reduced. Further, reduction of the wiring resistance by this bypass line path suppresses voltage drops (rises) in each of the power supply lines, and so leads to reduced power consumption.

By means of a circuit substrate of this invention having a power supply bus divided by a slit, brightness unevenness can be reduced without any process modifications in particular to materials, film thicknesses or similar, and without further increasing the frame. By this means, a high-quality organic EL panel can be realized inexpensively.

In particular, a slit having a shape with a closed perimeter within the power supply bus can prevent the occurrence of band-shape brightness unevenness arising from potential differences compared with a slit a portion of which is open. If a slit a portion of which is open is provided in a power supply bus, the power supply bus is divided into a plurality of buses. This is because, if there are even slight resistance differences between the divided buses, potential differences occur between the buses, and brightness unevenness arising from these potential differences occurs at the boundaries between power supply line groups connected to each of the buses.

Further, by means of the above surface-emitting display device including a connection line and bypass line path, by reducing the wiring resistance itself, voltage drops of the power supply lines are decreased (because the GND potential is lowered), so that power consumption can be reduced. In particular, by providing a connection line across power supply lines of subpixel columns (on which limits are not imposed, but which may for example be red, green, blue, and similar) forming one pixel column, brightness unevenness for each color becomes the same for the entire surface. Consequently even when performing software correction of brightness unevenness, there is no need for separate correction for each color.

BRIEF DESCRIPTION OF THE DRAWINGS

FIG. 7 shows schematic diagrams of various slit structures of a power supply bus of this invention, in which

EXPLANATION OF REFERENCE NUMERALS

21 Power supply line
22 Power supply bus
23 Power supply terminal
71 Slit hole with closed perimeter in power supply bus
72 Slit hole with unclosed perimeter in power supply bus
73 Data signal line

BEST MODE FOR CARRYING OUT THE INVENTION

Preferred Embodiment 1

Figure 6:
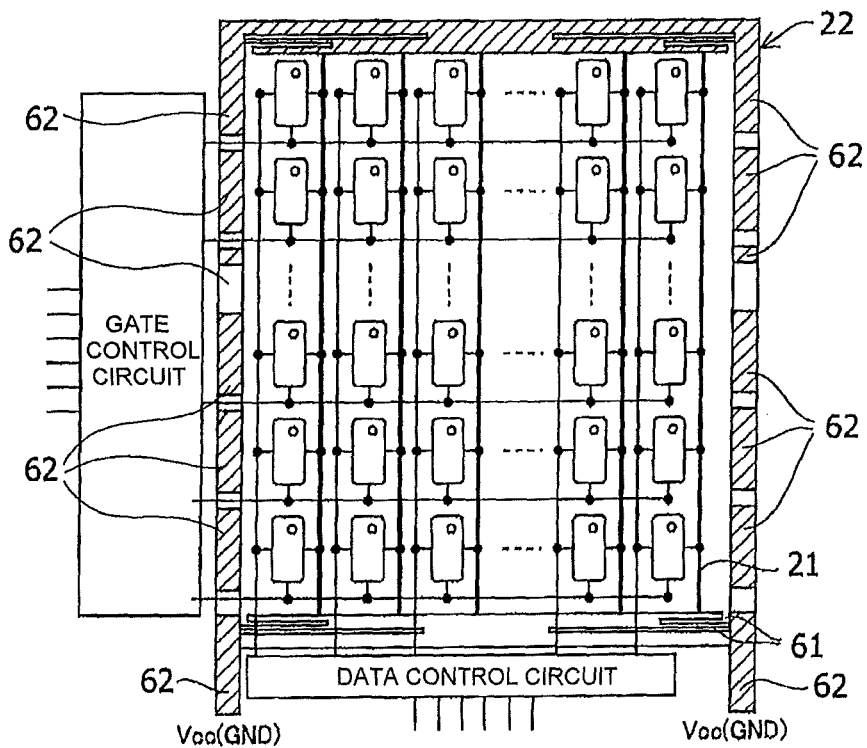
FIG. 6 is a schematic diagram showing the overall configuration of a circuit substrate of this invention having a power supply bus.

FIG. 6 is a schematic diagram of a power supply bus of this invention, and of a circuit substrate having this power supply bus. The slits 61 are narrow gaps or opening portions, and no limitations in particular are imposed on their number or length. And, the power supply bus 22 is divided into portions by these slits, and the divided portions are made thinner where connected to power supply lines closer to the power supply terminal among the plurality of power supply lines 21, and are made thicker where connected to more distant power supply lines. The numeral 62 indicates multilayer wiring portions in which the power supply bus has a layered structure. Portions of the power supply bus not intersecting with data signal lines or gate signal lines can be provided with a structure in which the same metal is layered. It is desirable that this structure have lateral symmetry.

Figure 7A:
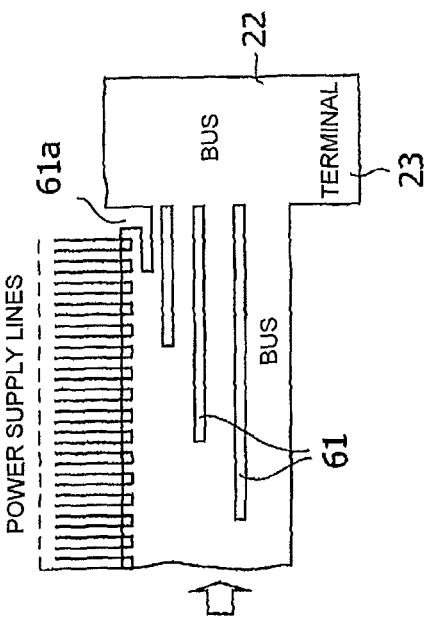
FIG. 7(a) shows a simple dividing structure.
Figure 7B:
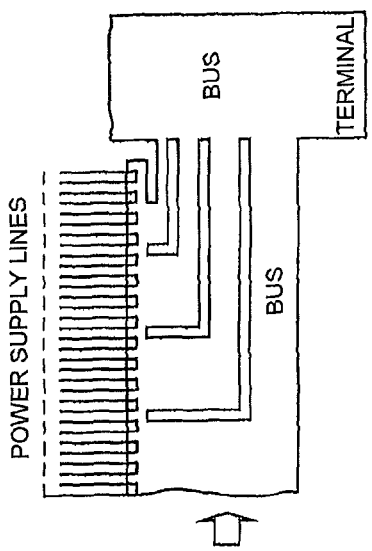
FIG. 7(b) shows a structure in which the power supply line connection portions are conjoined.
Figure 7C:
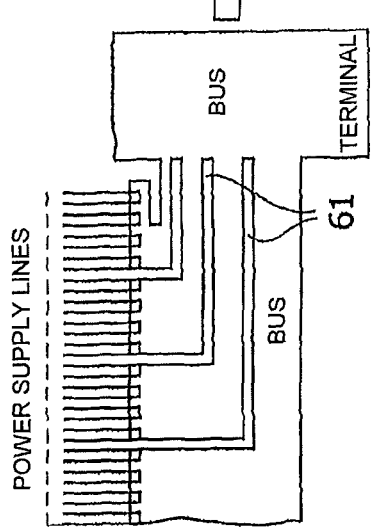
FIG. 7(c) shows the structure of FIG. 7(b) in simplified form.

Ideally, so-called constant-resistance wiring would be used, in which a power supply bus is not provided, and each power supply line is connected to a terminal, with the wiring thickness adjusted according to the distance from the terminal; but the minimum line width and line interval are determined by the process rule, and so when there are numerous wires, and when the ratio of maximum to minimum distance from terminal to power supply line is large, the frame is greatly increased in size, and so such a method is not practical. Hence as shown in FIG. 7(*a*), grouping of a certain number of adjacent power supply lines into blocks, formation of L-shape slits 61 for each block, and adjustment of the wire width, is conceivable. However, if slits 61 are formed up to positions reaching the bus periphery, and bus wiring is performed separately for each block, then variation in wiring resistance at the boundaries of separated blocks results in slight potential steps, that is, brightness steps, so that boundary lines become visible. This is because humans can recognize even such slight differences in brightness as 2 to 3%. Hence as shown in FIG. 7(*b*), by finally connecting, near the power supply line connection portions, all the bus portions for each block with wiring resistance adjusted, steps in potential occurring at block boundaries can be reduced. That is, this is equivalent to not forming the slits 61 up to positions reaching the bus periphery, but rather to providing slit holes with closed perimeters in the vicinities of connection portions with power supply lines within the power supply bus. Also, if slits are complicated, in addition to faults in patterning of the slits themselves, there is the possibility that narrow signal lines intersecting the power supply bus will overlap over a broad range, and so it is desirable that the shapes of slits 61 be for example I shapes, and be made as simple as possible in order to stabilize processes, as shown in FIG. 7(*c*). In all of these examples, a cutout 61*a* is inserted on the inside of the portion at which the row-direction power supply bus abuts the column-direction power supply bus, such that the power supply line block on the outermost side is moved away from the power supply bus in the column direction. As shown in (a), (b) and (c) of FIG. 7, the cutout 61*a* includes a first cutout portion and a second cutout portion that are positioned next to each other to form an L-shape cutout. The first cutout portion is formed between the plurality of power supply lines and the plurality of slits 61. The second cutout portion is substantially perpendicular to the first cutout portion and connects the first cutout portion to an outside of the power supply bus, to thereby form first and second edges on the power supply bus. The second cutout portion is so positioned that all of the plurality of power supply lines being on a same side of the first edge. The plurality of slits 61 each have an end that is aligned with the second edge of the power supply bus. Further, as shown in FIG. 7, at least one of the plurality of slits includes a third cutout portion and a fourth cutout portion that are positioned next to each other to form another L-shape cutout, the third cutout portion being parallel to the power supply lines, and the fourth cutout portion being substantially perpendicular to the third cutout portion.

Next, the greater the number of slits, the more uniform potential unevenness becomes, but if the number is made too great, the effective bus width decreases and resistance increases, and so adjustment should be performed appropriately according to requirements for uniformity (brightness unevenness specification). For example, in a panel of approximately 3 inches, when the bus width is approximately 2 mm, from simulations of potential distribution (0.01 V intervals), uniformity was found to be sufficient for approximately four to six divisions, as in FIG. 11. Upon viewing the potential distribution (see FIG. 10) of slit portions in the power supply bus in these simulation results, potentials at the slit end portions are approximately equal as a result of such power supply bus divisions. This can be seen from the fact that in FIG. 9(*b*) each of the slit end portions belongs to a region enclosed by the same equipotential line compared with FIG. 9(*a*).

Further, as the places and ranges for arrangement of slit groups, placement is necessary only at each place where brightness unevenness is concentrated. In the case of a wiring pattern where there are power supply terminals at two places and there are also two power supply line connection portion sides, as in FIG. 2, placement is at four locations, as in FIG. 6; but when a terminal is at one place and there is also only one power supply line-bus connection portion side, placement at one place is sufficient.

When as in FIG. 6 power supply lines 21 are connected at two places at both ends to two bus sides, if the bus width is not adequate, the potentials at both ends of each power supply line need not necessarily be made to coincide, and the slit shapes and similar may be adjusted independently at each of the sides of the bus, and the potentials at connection portions rendered uniform at the respective sides (row direction). If, in a state in which the bus width is not adequate, the potentials at both ends of each power supply line are made to coincide, then the widths of all divided bus portions must be narrowed in order to increase the wiring resistance on the side near the power supply terminal, and the power supply bus width which is originally allowed can no longer be utilized effectively. As a result, even if uniformity is achieved, the overall potentials may rise considerably, and power consumption may increase, and so caution is necessary. When adjusting the potentials at connection portions of power supply lines and the bus at both ends of power supply lines to be uniform independently for each bus edge, the width of the entire bus is not decreased, and so the rise in potential and increase in power consumption due to introduction of slits are very small. Of course, this is not necessarily the case when an adequate bus width can be secured, when the potential difference at both ends of a power supply line is small to begin with, and when resistance can be lowered through layering or other means.

Figure 2A:
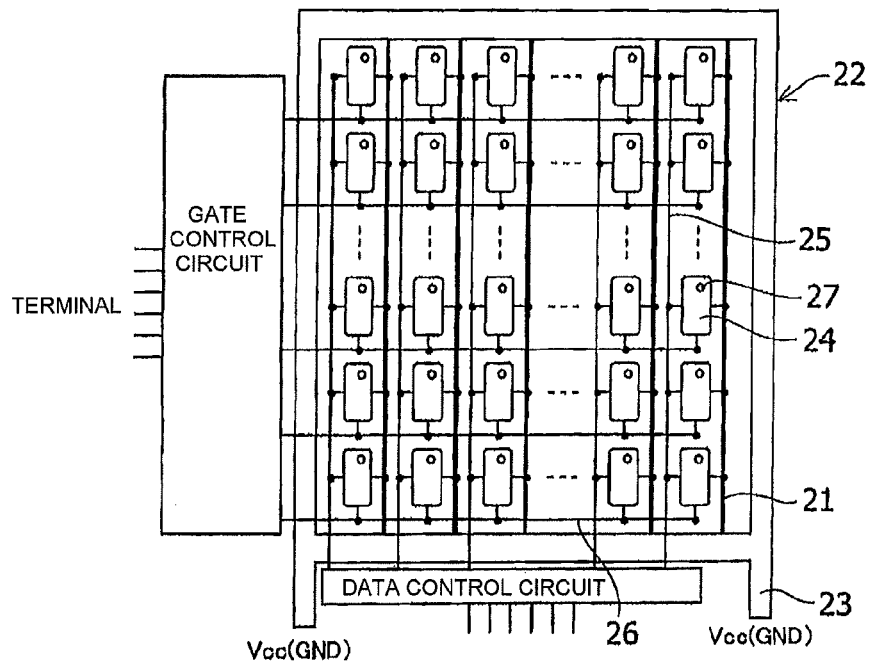
FIG. 2(a) is a schematic diagram of the overall configuration of cathode wiring of a conventional TFT circuit substrate.
Figure 2B:
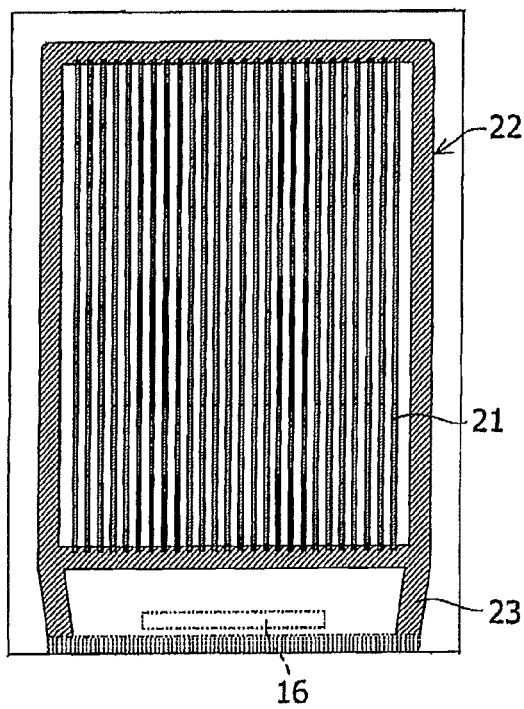
FIG. 2(b) is a schematic diagram of the cathode wiring of a conventional TFT circuit substrate.

Next, further lowering of the bus resistance is considered. Data signal lines and scan signal lines intersect with the power supply bus while preserving insulation, but as shown in FIG. 2(*a*), do not necessarily intersect over the entire bus surface. Hence as shown in FIG. 6, it is desirable that, in portions without intersections, by layering the power supply bus in the same layer as signal lines and forming a multilayer wiring portion 62, the resistance be further reduced. At this time, in the case of laterally symmetric arrangement of terminal and power supply bus, even if drawing-out of signal lines is asymmetric as in FIG. 6, it is desirable that the pattern of layered multilayer wiring portions (see numeral 62) be laterally symmetric. The method of bus layering may involve layering a second layer directly on a conductive first layer, or may entail interposing an insulating film between conductive first and second layers and connecting the two electrically via a contact hole. Further, when the row-direction bus is layered and formed, it is desirable that equivalent slits be inserted into each of the overlapping layers. However, even in a case in which a slit is formed in only one of the layers, so that a bus with a slit and a normal bus are layered, there is an effect in rendering uniform, albeit slight, and this is also within the scope of the present invention. In the case of such a layered structure, as described above, if an independent slit structure is employed in which the potentials at both end portions (that is, both ends; see FIG. 6) of a power supply line do not match, then no problems arise even when the layer configurations of the slit portions at both end portions are different, as in FIG. 6.

By means of such a structure, brightness unevenness is reduced, and when the brightness unevenness which still cannot be eliminated is a problem, a method can easily be used in which the image controller performs software correction of current instruction values. By means of a power supply bus slit structure, pixel columns in the direction perpendicular to the power supply lines all have uniform brightness, and in the parallel direction, unevenness is one-dimensional. Hence pixel columns in the direction perpendicular to the power supply lines can be corrected using a single coefficient. Hence it is sufficient to provide the image controller with memory for correction sufficient for only the number of pixels arranged in the direction of extension of the power supply lines. Moreover, setting of correction coefficients is simple.

Preferred Embodiment 2

Next, FIG. 12 through FIG. 16 are used to explain a circuit substrate in which, in addition to the power supply bus having slits of FIG. 6 through FIG. 9, connection lines are also added to connect together power supply lines.

Figure 12:
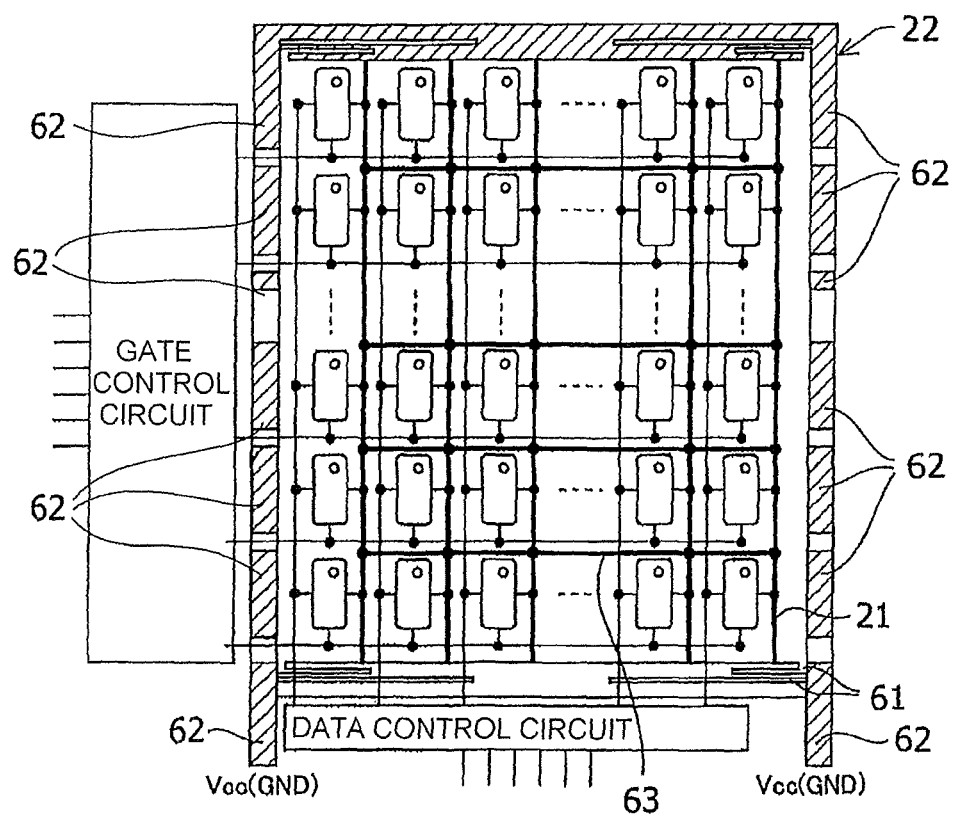
FIG. 12 is a schematic diagram of a power supply bus, power supply lines and connection lines thereof of this invention, and of a circuit substrate having these.

FIG. 12 is a schematic diagram of a circuit substrate including the power supply bus of FIG. 6 through FIG. 9 and connection lines 63 which connect together power supply lines 21. Here, arbitrary values can be used for the number and lengths of the slits provided in the power supply bus 22 of FIG. 12, and no limitations in particular are imposed. It is important that slits 61 be formed such that the power supply bus is divided into portions, and that the divided portions are thinner where connected to power supply lines near the power supply terminal, and are thicker where connected to more distant power supply lines. And, the connection lines 63 connect together power supply lines 21 which are adjacent in the direction perpendicular to the direction of extension of the power supply lines 21.

Figure 8A:
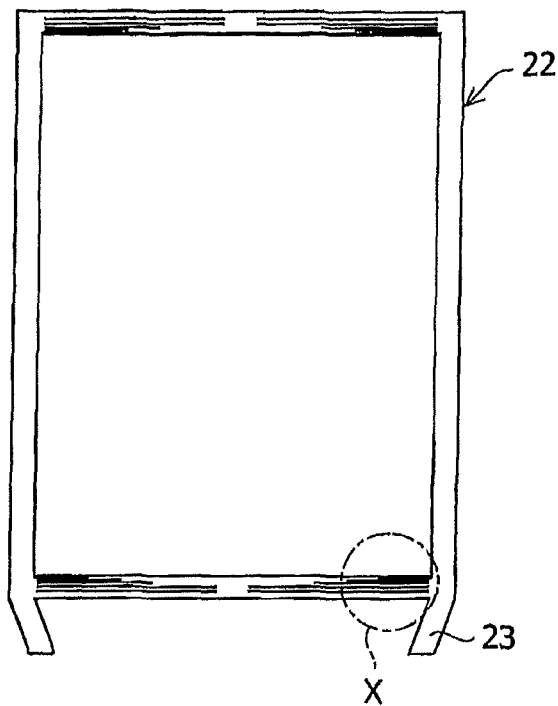
FIG. 8(a) is an overall view of (the cathode side of) a power supply bus of this invention.
Figure 8B:
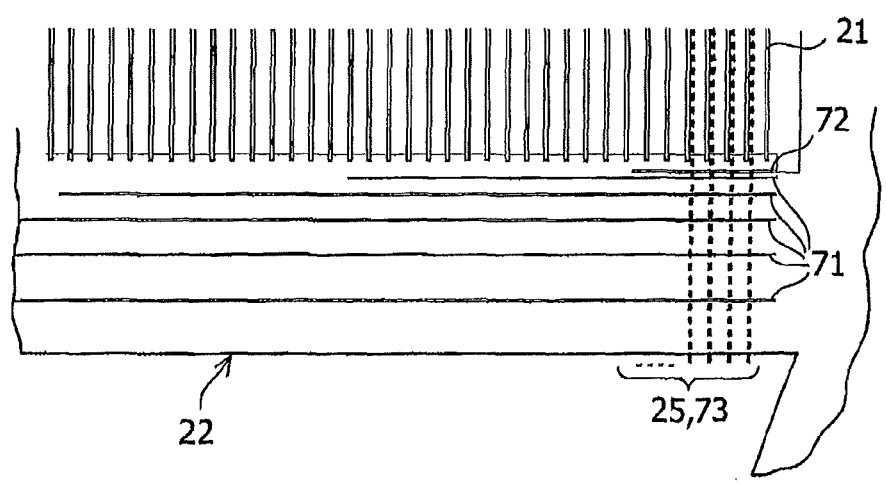
FIG. 8(b) is an enlarged view of the slit portion (X portion)
Figure 13A:
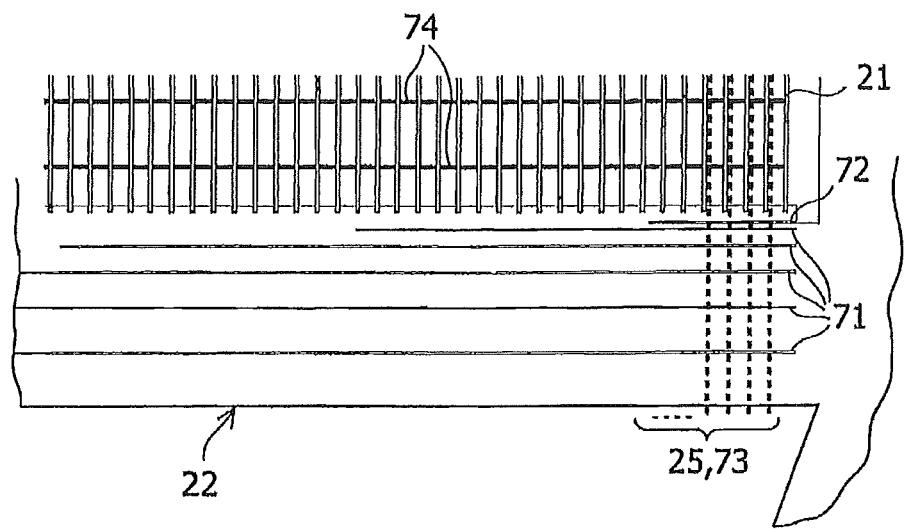
FIG. 13(a) is an enlarged schematic diagram of connection lines 74 connecting together power supply lines 21 connected to the power supply bus of FIG. 12.
Figure 13B:
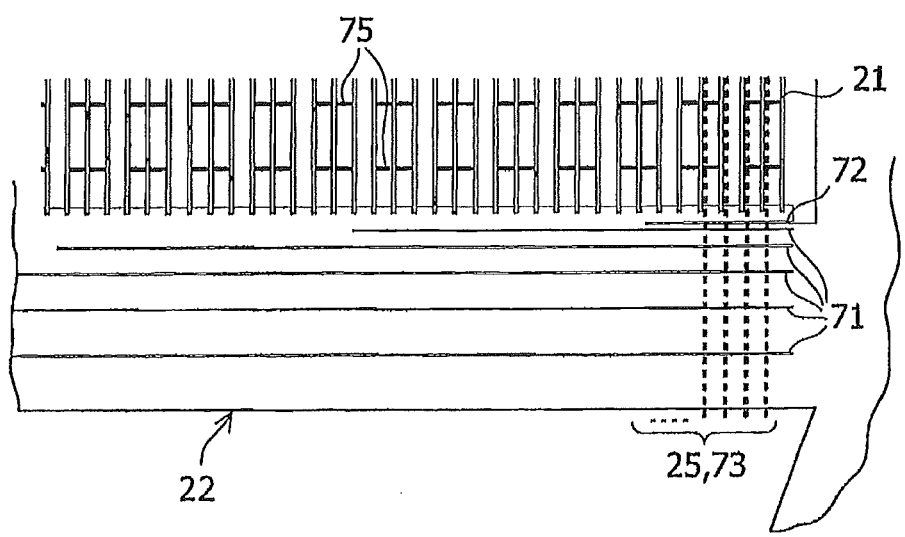
FIG. 13(b) is an enlarged schematic diagram of connection lines 75 connecting together power supply lines 21 connected to the power supply bus of FIG. 12.

FIG. 13(a) and FIG. 13(b) are enlargements of portions equivalent to the X portion in FIG. 8, in the circuit substrate of FIG. 12, and are enlarged schematic diagrams of the connection lines 74, 75 connecting together power supply lines 21 connected to the power supply bus. Here, connection to an adjacent power supply line 21 may be performed to connect all power supply lines 21, from one end of the screen to the other end, as with the connection lines 74 in FIG. 13(a). Alternatively, termination may be performed for each set of power supply lines forming one pixel column, as with the connection lines 75 of FIG. 13(b). FIG. 13 (b) shows a case in which one pixel comprises subpixels of three colors of red, green and blue, and both ends of the connection lines 75 are terminated for each set composed of three power supply lines 21 connected to the respective subpixels. Here, this is applied to the case in which one pixel comprises subpixels of four colors of red, green, blue and white, and the case in which one pixel comprises intermediate colors or two colors; both ends may be terminated for each set composed of four power supply lines in the former case, and for each set composed of two power supply lines in the latter case. These connection lines 63, 74, 75 are not connected to the power supply bus in the direction of extension thereof. The reason for this is that, although connection to the power supply bus in the direction of extension would reduce voltage drops, current would not flow in the direction in which slits exist, and would be concentrated near the power supply terminal. That is, when in FIG. 12 current flows not only in the direction of extension of the power supply lines 21 (the vertical direction, or the column direction), but also in the direction of extension of the connection lines 63 (the horizontal direction, or the row direction), the effect of the slits 61 and similar provided in the power supply bus 22 is not adequately exhibited.

On the other hand, if all the power supply lines are connected together by connection lines, as in the case of the connection lines 74 of FIG. 13(a), then when a pattern is displayed in which only pixels in the center portion of the screen are lit (hereafter called a "white-on-black pattern"), current also flows in the power supply lines of non-emitting portions. Consequently, there is the possibility of the occurrence of slight brightness unevenness such that places near non-emitting portions become bright. On the other hand, in a structure in which connection lines of power supply lines are cut at every pixel column normally formed by RGB or other two to four subpixel units, as in the case of the connection lines 75 of FIG. 13(b), there is no current flowing on the side of adjacent pixel columns, so that there is no occurrence of brightness unevenness in the direction of extension of the connection lines 75 (the horizontal direction in FIG. 13).

Figure 14:
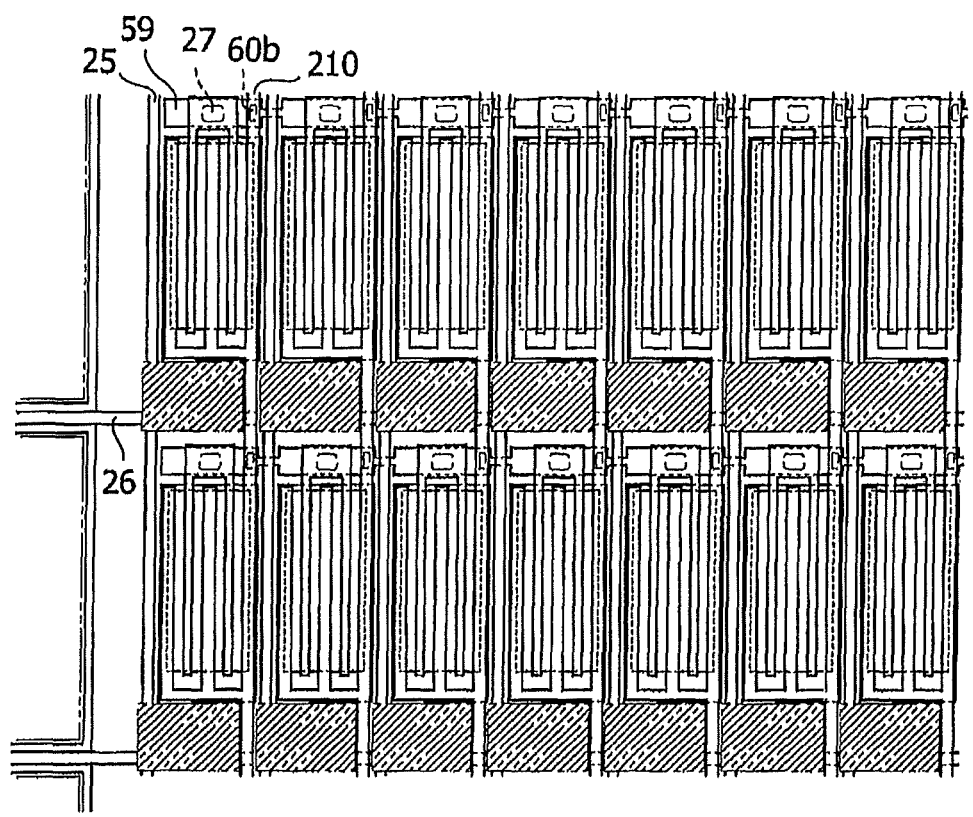
FIG. 14 is an enlarged schematic diagram of a pixel portion in the circuit substrate of FIG. 13(a)

FIG. 14 is an enlarged schematic diagram of a pixel portion in FIG. 13(a), and shows an example of a specific connection configuration in the vicinity of a pixel portion to connect together power supply lines 21 with connection lines 74. In FIG. 14, connection lines 59 extending in the row direction of pixels, and power supply lines 210 of pixels, are connected at contact points 60b. Such connection lines may be fabricated by providing a dedicated layer, but in order not to increase costs, it is desirable that unused space be employed and lines fabricated using an existing layer.

Figure 3A:
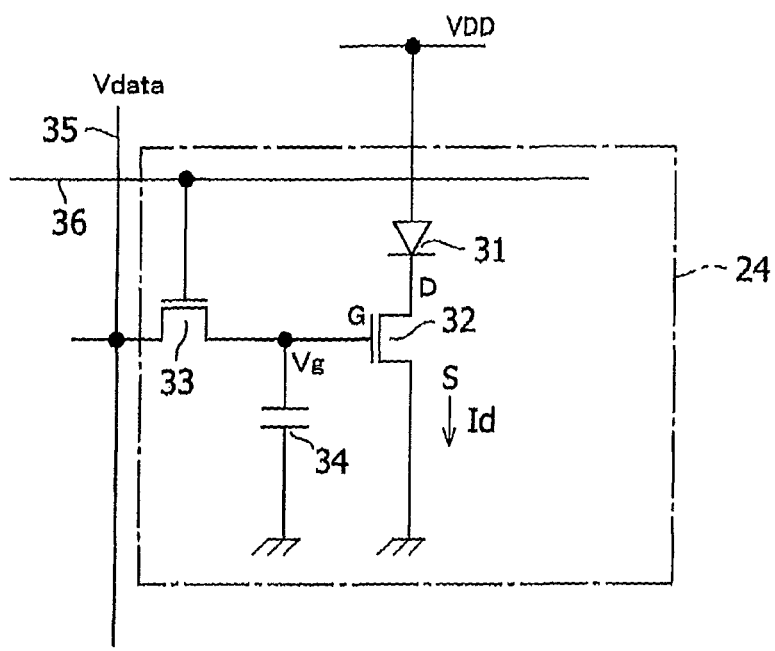
FIG. 3A shows an example of a pixel circuit of a general TFT circuit substrate.
Figure 3B:
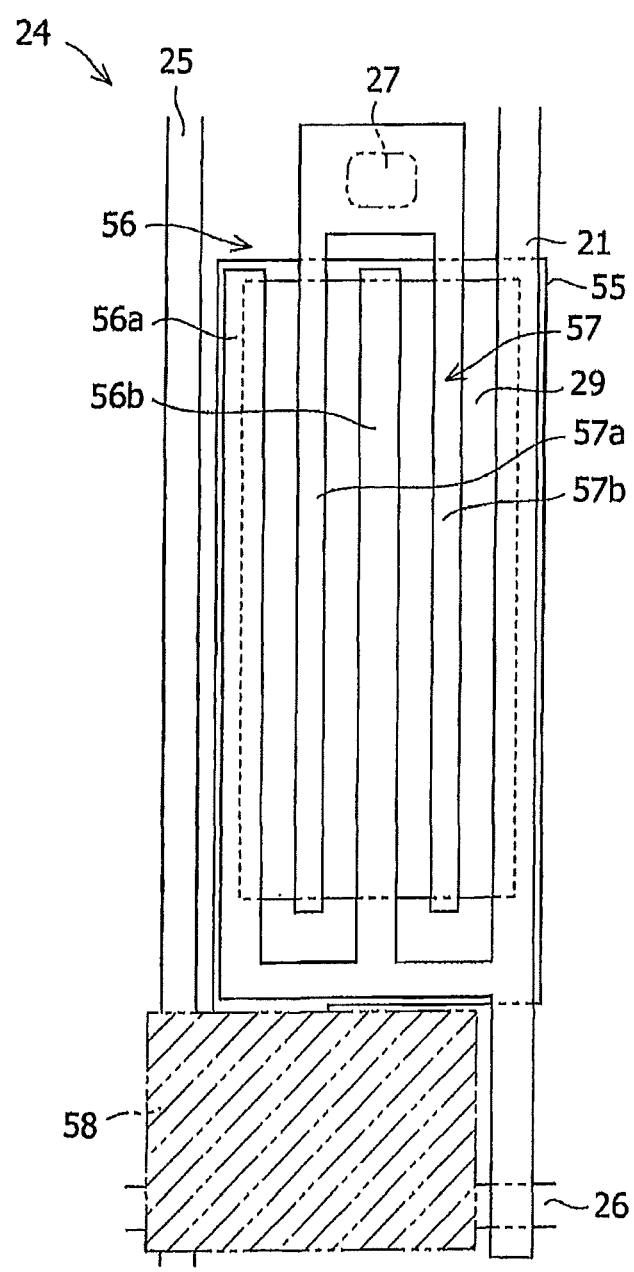
FIG. 3B is a schematic diagram showing the wiring structure of the principal transistor in particular in a pixel circuit of a general TFT circuit substrate.
Figure 4A:
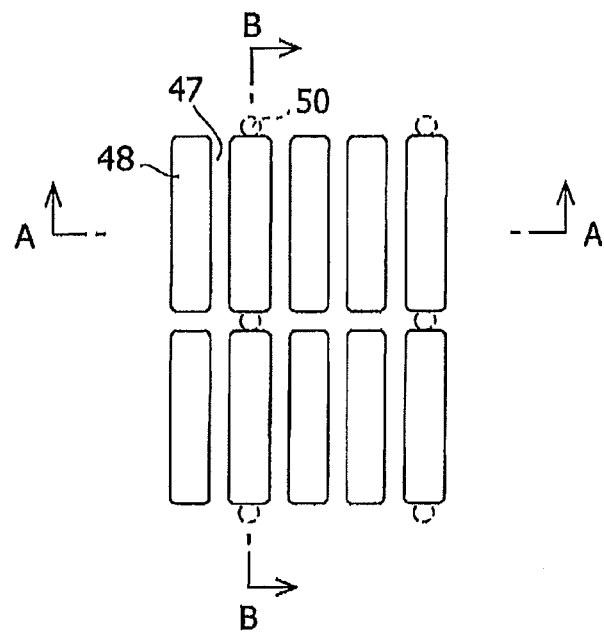
FIG. 4A shows a pixel portion of a top-emission type organic EL panel.
Figure 4B:
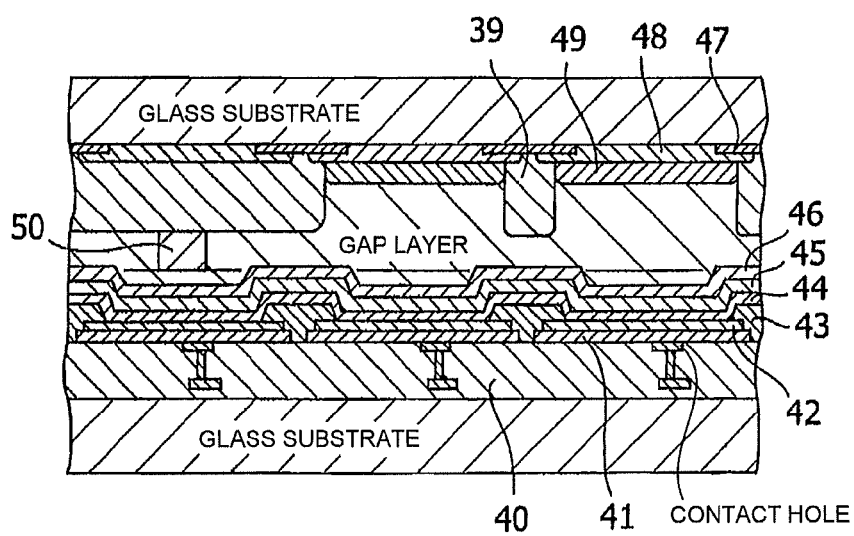
FIG. 4B is a cross-sectional view along line AA in FIG. 4A(a)
Figure 4C:
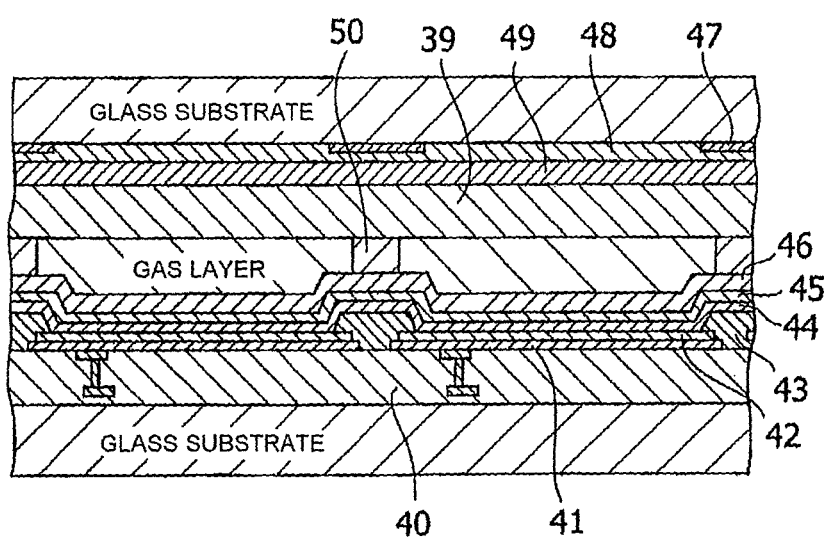
FIG. 4C is a cross-sectional view along line BB in FIG. 4A(a)
Figure 5A:
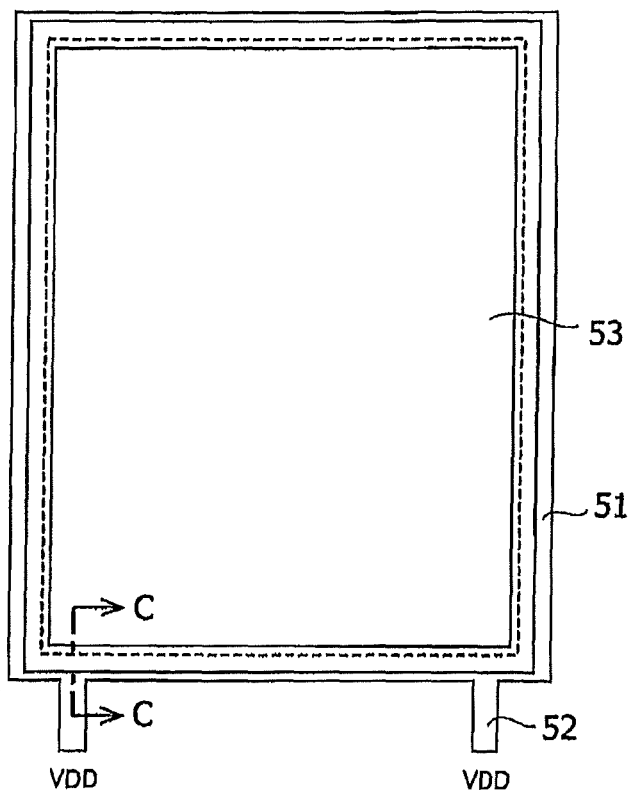
FIG. 5A shows an upper common electrode, having full-coverage wiring common to all pixels.
Figure 5B:
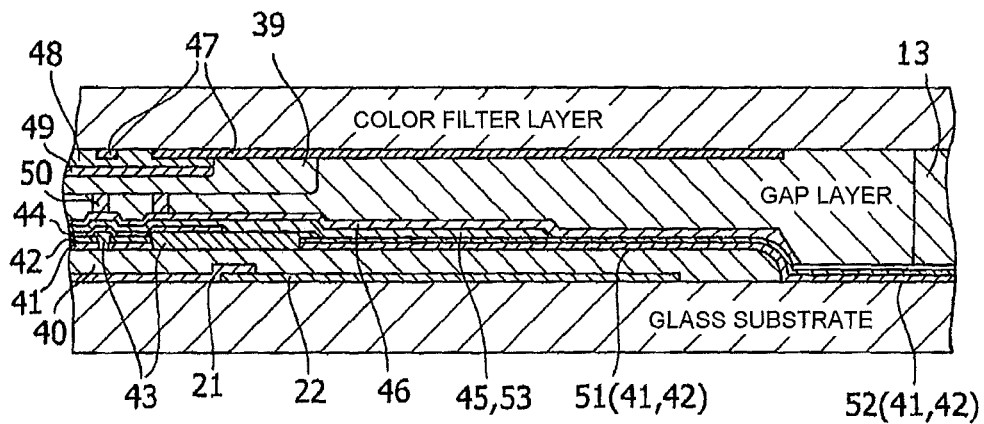
FIG. 5B shows the cross-sectional structure of a penal along line CC in FIG. 5A(a)
Figure 15:
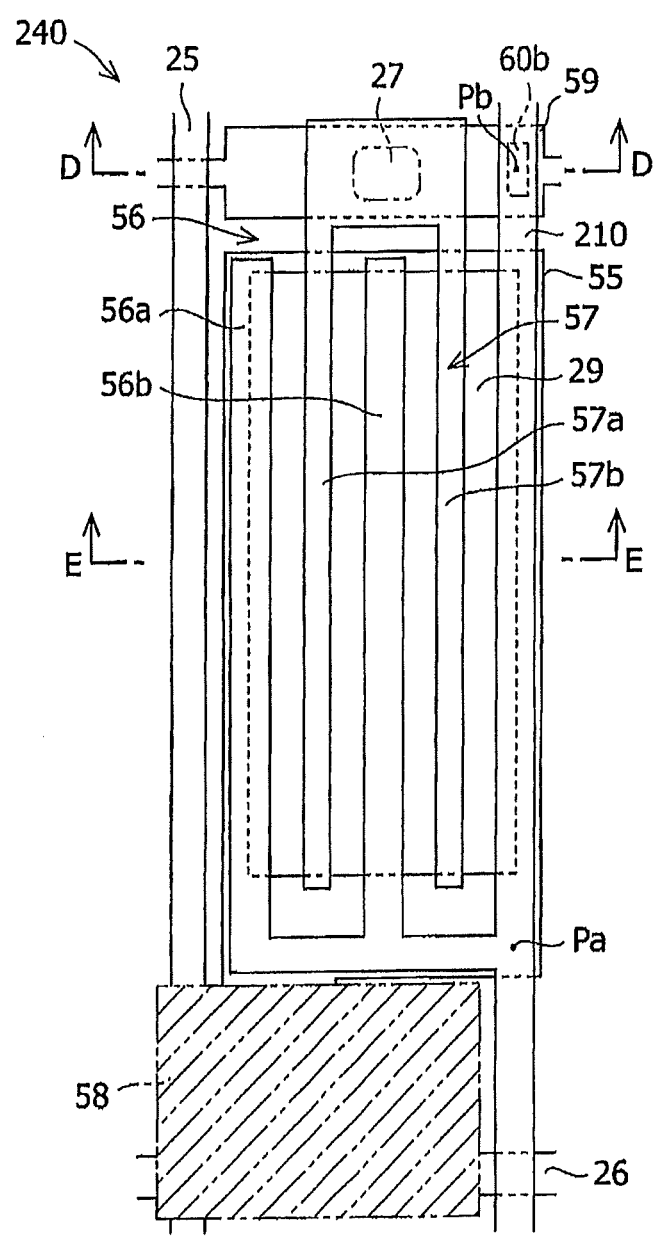
FIG. 15 is an enlarged schematic diagram of the wiring pattern of the pixel portion shown in FIG. 14.

FIG. 15 is a further enlarged schematic diagram of the pixel portion of FIG. 14, and is equivalent to FIG. 3B. FIG. 15 shows an example of a wiring structure of a pixel circuit 240, such that the connection line 59 is provided below the contact hole portion 27. In this wiring structure, the gate wiring pattern 55 (see FIG. 16(b)) is formed as a first-layer metal wiring pattern, and moreover a source wiring pattern 56 (see FIG. 16(b)), drain wiring pattern 57, and the power supply line 210 are each formed, as second-layer metal wiring patterns, on this gate wiring pattern 55, with an insulating layer 64 (see FIG. 16(b)) and Si layer 29 interposed.

A gate control element region 58 is provided adjacent to the gate wiring pattern 55. In this gate control element region 58 are provided the TFT 33 and capacitor 34 shown in FIG. 3A, and moreover the data signal line (source signal line) 25, which is a second-layer metal wiring pattern, and scan signal line (gate signal line) 26, which is a first-layer metal wiring pattern, are connected.

The source wiring pattern 56 is provided as wiring which forms the source of the TFT 32 shown in FIG. 3A. The base portion of this source wiring pattern 56 is connected to point Pa of the power supply line 210, and moreover the tip portion is branched into a comb shape, to form branch portions 56a, 56b parallel to the power supply line 210.

On the other hand, the drain wiring pattern 57 is provided as wiring which forms the drain of the TFT 32. The base portion of this drain wiring pattern 57 is positioned above the wiring pattern for bypass formation 59, and this drain wiring pattern 57 has a branch portion 57a extending from the base portion to between the branch portions 56a, 56b of the source wiring pattern 56, and a branch portion 57b extending from the base portion to between the branch portion 56b and the power supply line 210. That is, the drain wiring pattern 57 has comb-shape branch portions which mesh with the comb-shape branch portions of the source wiring pattern 56.

The number of branches of the source wiring pattern 56 and the number of branches of the drain wiring pattern 57 may be three or greater.

Here, the wire width of the connection line 59 of FIG. 15 is made wide and steps are eliminated directly below the contact hole 27 in order to stabilize the hole shape, and is made narrow where the data signal line 25 is traversed in order to reduce parasitic capacitance. In this way, it is desirable that the connection line 59 be shaped so as not to exert an adverse influence on operation of the existing circuit.

From the standpoints of reduction of brightness unevenness, decreasing power consumption, uniformity of wiring patterns, and similar, a structure is desirable in which connection lines 63 connecting together power supply lines 21 are provided across all pixels as shown in FIG. 12. However, as the number of wires traversing signal lines increases, parasitic capacitances increase, operation becomes slower, and other problems arise. Hence the thicknesses and number of connection lines, and connection positions, should be designed appropriately, and so no limitations in particular are imposed. For example, a structure in which connection lines 59 are provided every several tens of pixel rows (in the vertical direction in FIG. 14), and, in extreme cases, a structure in which a single connection line 59 is provided in the center portion of the screen, are also effective, and so these structures are also included in the scope of the invention. Further, in the case shown in FIG. 14 in which numerous connection lines 59 are provided, only slight currents flow in each of the connection lines 59. Hence it is desirable that the thicknesses of intersection portions of the connection lines 59 and signal lines 25 be made as narrow as possible (that is, to the minimum line width possible in micromachining (minimum rule)). In addition, in order to further reduce parasitic capacitances, connections to wires on a planarizing resin may first be made at the intersection portions, and bridge connections to neighboring power supply lines (not shown) may then be made.

Figure 16A:
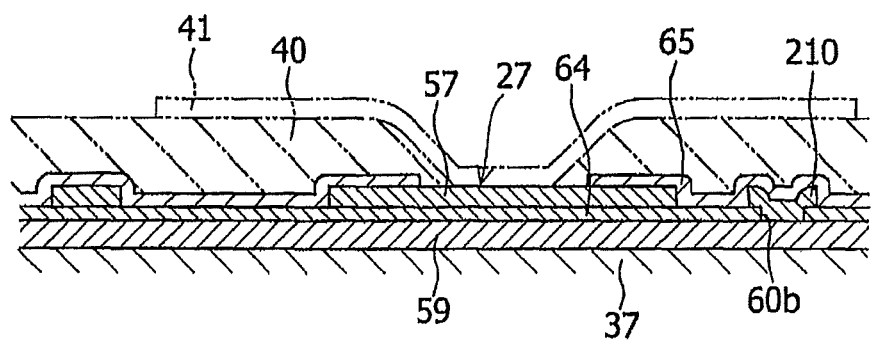
FIG. 16(a) is a cross-sectional view along line DD in FIG. 15.
Figure 16B:
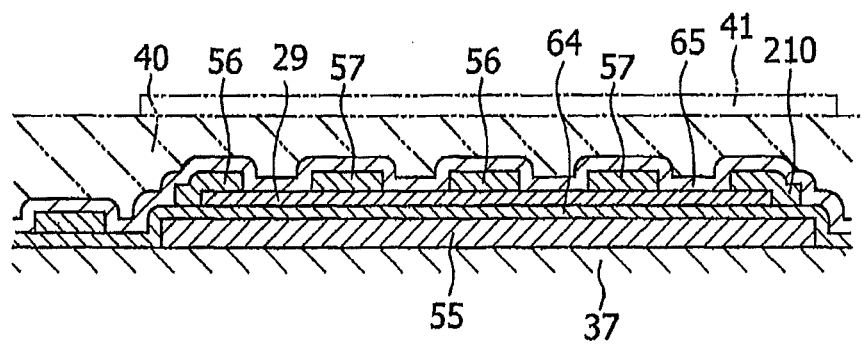
FIG. 16(b) is a cross-sectional view along line EE in FIG. 15.

FIG. 16(a) and FIG. 16(b) are the D-D cross-sectional view and the E-E cross-sectional view, respectively, of FIG. 15. As shown in FIG. 16(a), one end of the connection line 59, which is a first-layer metal wiring pattern, is electrically connected to the power supply line 210 (point Pb in FIG. 15) via the contact hole 60b. On the other hand, the base portion of the drain wiring pattern 57 is arranged above the connection line 59 with the insulating layer 64 and Si layer 29 interposed. On the base portion of this drain wiring pattern 57 is formed the region for a contact hole 27 connecting the drain wiring pattern 57 and an EL emission element, not shown. As a result, the connection line 59 is positioned below the region of the contact hole 27.

Positioning the connection line 59 below the region of the contact hole 27 as described above has the following advantage.

That is, transistors or other element patterns are not normally arranged below the contact hole 27, due to concerns of stress and depressions or protrusions. Hence if a connection line 59 is provided below the region of the contact hole 27, reduction of the effective area within the pixel due to formation of this connection line 59 can be avoided.

In FIG. 16(a) and FIG. 16(b), the numeral 37 denotes a glass substrate, the numeral 40 denotes a planarizing resin layer, the numeral 65 denotes a passivation layer, and the numeral 41 denotes a reflective electrode layer or an underlayer.

By means of the structures shown in FIG. 14 through FIG. 16, when there is a large difference in the current balance between the red, blue, green, or other-color subpixels forming one pixel, current is caused to be distributed from power supply lines passing large currents to the side of power supply lines in which only small currents flow, and voltage drops (voltage rises) in power supply lines can be averaged and suppressed. That is, with brightness unevenness during full-surface lighting suppressed, brightness unevenness between colors can also be held to approximately the same level. And, if voltage drops can be reduced, to this extent power supply voltages can be lowered, so that power consumption can also be reduced.

When brightness unevenness which nonetheless cannot be eliminated is a problem, a method can easily be used in which the image controller performs software correction. That is, unevenness is made one-dimensional by the power supply bus slit structure, so that pixel columns in the direction perpendicular to power supply lines can be corrected using a single coefficient, and so it is sufficient to provide the image controller with correction memory sufficient for the number of pixels arranged in the direction of extension of the power supply lines. Moreover, there is no practical problem with using the same correction coefficient for all colors.

Preferred Embodiment 3

Figure 17:
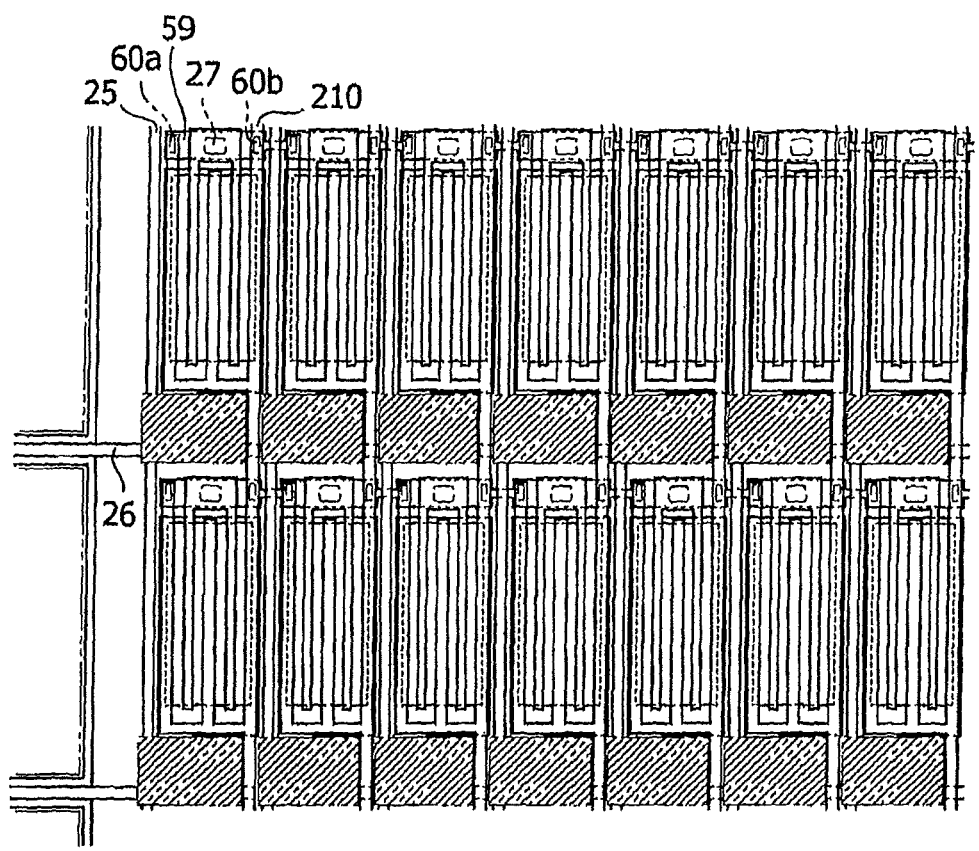
FIG. 17 is an enlarged schematic diagram of a pixel portion in a circuit substrate to which a power supply line bypass line path has been added.
Figure 18:
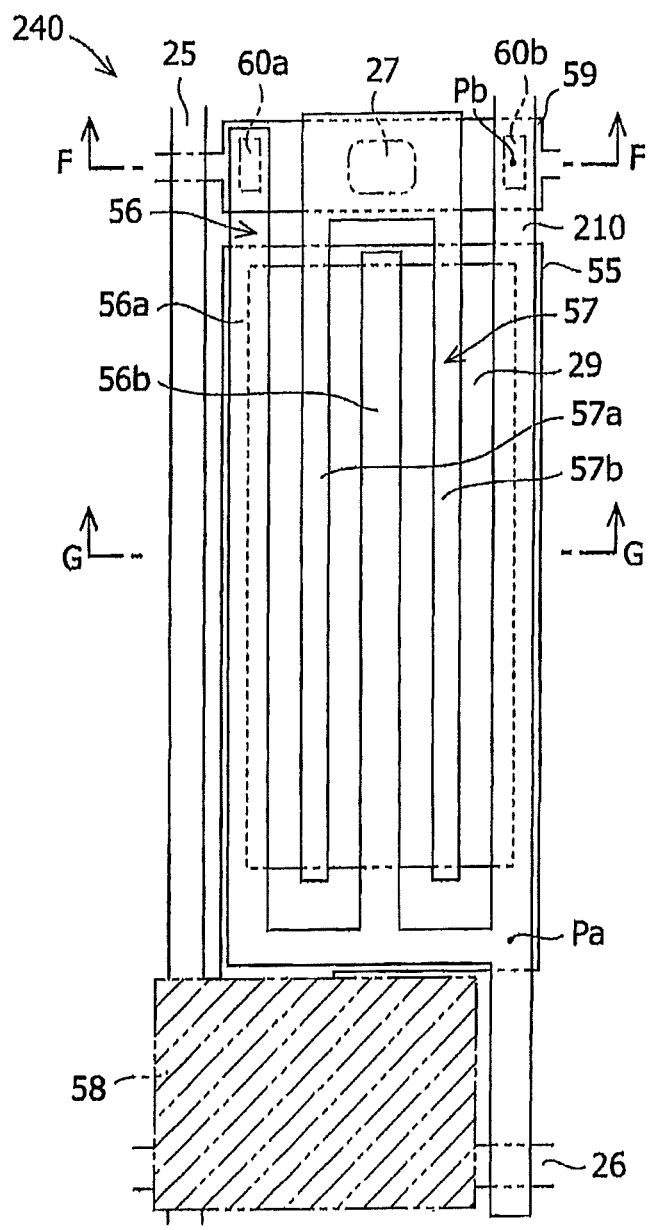
FIG. 18 is an enlarged schematic diagram of the wiring pattern of the pixel portion shown in FIG. 17.

FIG. 17 through FIG. 19 show an example of a TFT circuit substrate in which a bypass line path to reduce wiring resistance of power supply lines 210 has been added to the configuration of FIG. 14 through FIG. 16. This example focuses on the fact that the source wiring pattern 56a of FIG. 15 is at the same potential as the cathode. As shown in FIG. 18, this bypass line path is formed connecting the source wiring pattern 56 to the connection line 59 via the contact hole 60a. Hence compared with the configuration of FIG. 14 through FIG. 16, in addition to effective utilization of space, wiring resistance of the power supply line 210 can be reduced. This bypass line path is disclosed in an international patent application (PCT/JP2008/061967) submitted by the applicant of this application on Jul. 2, 2008, and the contents thereof are incorporated into this specification by reference.

As the manufacturing process for FIG. 17 through FIG. 19, the manufacturing process for FIG. 14 through FIG. 16, which is that of "Example 2" described below, can be employed.

FIG. 17 is an enlarged schematic diagram of a pixel portion for an example in which bypass line paths to reduce wiring resistance of power supply lines 210 are added to the connection configuration of FIG. 14. In FIG. 17, the connection lines 59 extending in the row direction of pixels are connected via the contact holes 60a to the source wiring patterns 56, and are connected to the power supply lines 210 of the pixels via the contact holes 60b.

FIG. 18 is a schematic diagram showing one example of the wiring structure of a pixel circuit 240. In this wiring structure, the gate wiring pattern 55 (see FIG. 19(b)) is formed as a first-layer metal wiring pattern, and moreover a source wiring pattern 56 (see FIG. 19(b)), drain wiring pattern 57, and the power supply line 210 are each formed as second-layer metal wiring patterns on this gate wiring pattern 55, with an insulating layer 64 (see FIG. 19(b)) and Si layer 29 interposed.

The gate control element region 58 is provided adjacent to the gate wiring pattern 55. In this gate control element region 58, the TFT 33 and capacitor 34 shown in FIG. 3A are provided, and moreover the data signal line (source signal line) 25, which is a second-layer metal wiring pattern, and scan signal line (gate signal line) 26, which is a first-layer metal wiring pattern, are connected.

The source wiring pattern 56 is provided as wiring which forms the source of the TFT 32 shown in FIG. 3A. The base portion of this source wiring pattern 56 is connected to point Pa of the power supply line 210, and moreover the tip portion is branched into a comb shape, to form branch portions 56a, 56b parallel to the power supply line 210.

On the other hand, the drain wiring pattern 57 is provided as wiring which forms the drain of the TFT 32. The base portion of this drain wiring pattern 57 is positioned above the connection line 59, and this drain wiring pattern 57 has a branch portion 57a extending from the base portion to between the branch portions 56a, 56b of the source wiring pattern 56, and a branch portion 57b extending from the base portion to between the branch portion 56b and the power supply line 210. That is, the drain wiring pattern 57 has comb-shape branch portions which mesh with the comb-shape branch portions of the source wiring pattern 56.

The number of branches of the source wiring pattern 56 and the number of branches of the drain wiring pattern 57 may be three or greater.

Figure 19A:
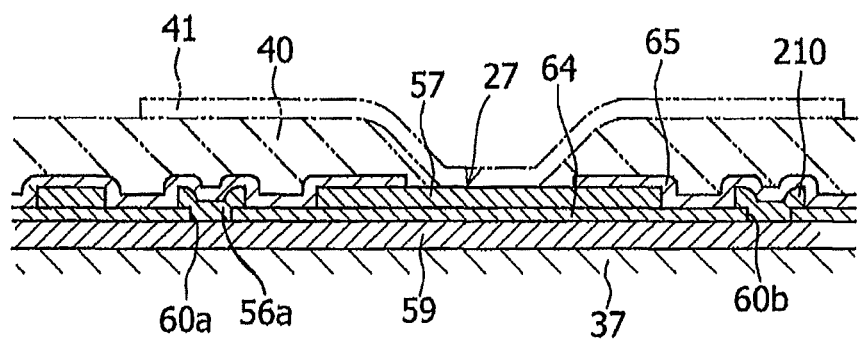
FIG. 19(a) is a cross-sectional view along line FF in FIG. 18.
Figure 19B:
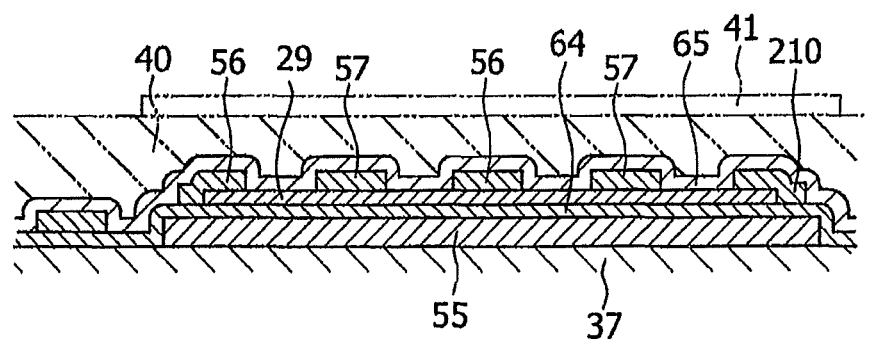
FIG. 19(b) is a cross-sectional view along line GG in FIG. 18.

FIG. 19(a) and FIG. 19(b) are the F-F cross-sectional view and the G-G cross-sectional view, respectively, of FIG. 18. As shown in FIG. 19(a), one end of the connection line 59, which is a first-layer metal wiring pattern, is electrically connected to the source wiring pattern 56 (tip portion of the branch portion 56a) via the contact hole 60a, and the other end is electrically connected to the power supply line 210 (point Pb of FIG. 18) via the contact hole 60b. Hence the source wiring pattern 56 and connection line 59 form a bypass line path which leaves from the power supply line 210 and returns again to the power supply line 210.

On the other hand, the base portion of the drain wiring pattern 57 is arranged on the connection line 59 with the insulating layer 64 and Si layer 29 interposed. On the base portion of this drain wiring pattern 57 is formed the region for a contact hole 27 connecting the drain wiring pattern 57 and an EL emission element, not shown. As a result, the connection line 59 is positioned below the region of the contact hole 27.

Positioning the connection line 59 below the region of the contact hole 27 as described above has the following advantage. That is, transistors or other element patterns are not normally arranged below the contact hole 27, due to concerns of stress and depressions or protrusions. Hence if a connection line 59 is provided below the region of the contact hole 27, reduction of the effective area within the pixel due to formation of this connection line 59 can be avoided.

In FIG. 19(a) and FIG. 19(b), the numeral 37 denotes a glass substrate, the numeral 40 denotes a planarizing resin layer, the numeral 65 denotes a passivation layer, and the numeral 41 denotes a reflective electrode layer or an underlayer.

By means of a surface-emitting display device having the configuration of FIG. 17 through FIG. 19, bypass line paths formed by a source wiring pattern 56 and connection line 59 are formed in each of the pixel circuits 240. These bypass line paths are connected in parallel with the power supply lines 210. Hence the electrical resistance of the power supply lines 210 is lowered at sites at which the bypass line paths are connected in parallel.

This lowering of electrical resistance suppresses voltage drops (rises) in each of the power supply lines 210, and so reduced power consumption. Also, lowering of the electrical resistance renders uniform the voltage applied to emission elements of each of the pixel circuits 240 on the circuit substrate connected to each of the power supply lines 210, leading to reduction of so-called brightness unevenness.

As stated above, the bypass line path is formed using the source wiring pattern 56 provided as wiring to form the source of the TFT 32, so that the area of formation of the transistor in the pixel circuit 240 can easily be reduced. That is, the bypass line path can be formed without securing a special space for placement within the pixel circuit 240.

In FIG. 18, the end portion of the gate wiring pattern 55 is positioned below the power supply line 210, but this end portion need not be positioned below the power supply line 210.

Preferred Embodiment 4

Figure 20:
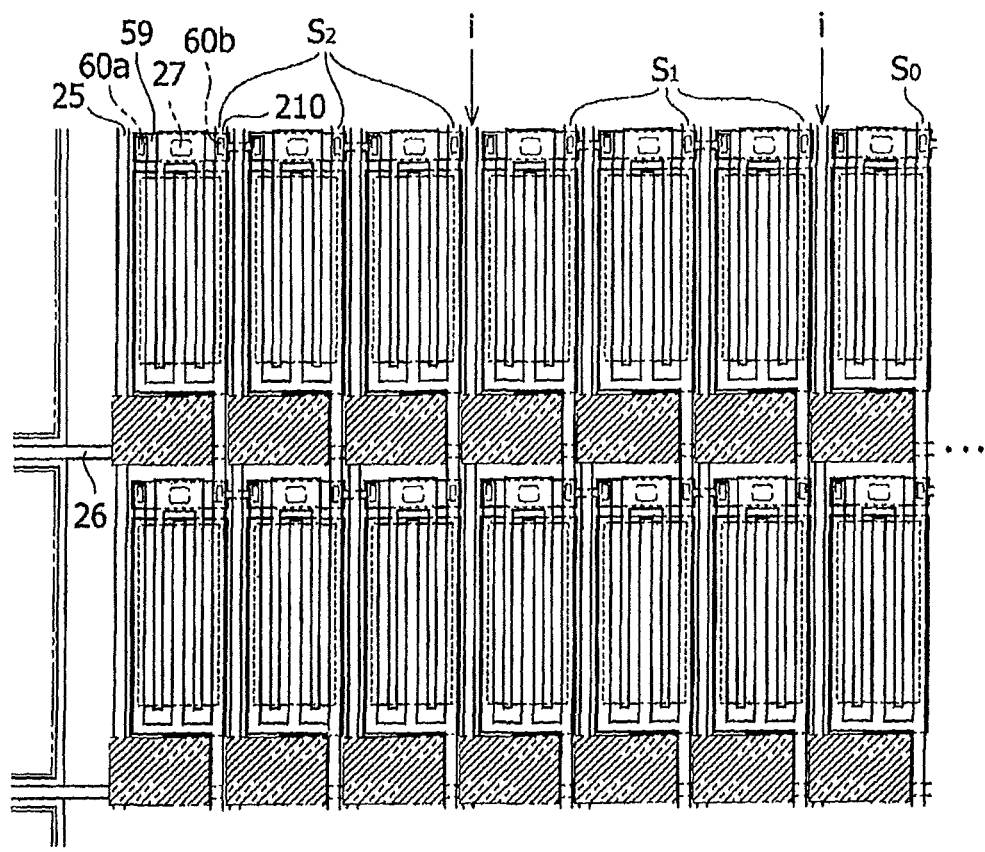
FIG. 20 is an enlarged schematic diagram of a pixel portion in a circuit substrate, showing that the connection lines 59 of FIG. 18 are connected to each of the power supply lines of the three RGB pixel columns.

Next, FIG. 20 shows an enlarged schematic diagram of a configuration in which a connection line 59, forming a portion of a bypass structure of the power supply lines 210 of FIG. 18, is connected to the power supply lines of each of the subpixel columns of the three RGB colors, forming sets. The sets $S_0$, $S_1$, $S_2$ of power lines 210 are grouped as units of three power supply lines connected to the columns of adjacent subpixels of three colors, that is, to the columns of single pixels. The connection lines 59 are terminated within one set $S_1$, and as indicated by the arrow i in the figure, are not connected to the power supply lines 210 of the other sets $S_0$, $S_2$ adjacent to the set $S_1$.

As the manufacturing process for FIG. 20, the manufacturing process for FIG. 14 through FIG. 16, which is that of "Example 2" described below, can be employed.

Example 1

An example of a manufacturing process for the structure of FIG. 6 through FIG. 9 is described. The pixel dimensions of the panel are 60 μm×180 μm×RGB, the number of pixels is 240 RGB horizontal×320 vertical QVGA, the screen size is approximately 3 inches, the power supply bus allowed width is approximately 2 mm, and power supply terminals are drawn out at two places.

Figure 9A:
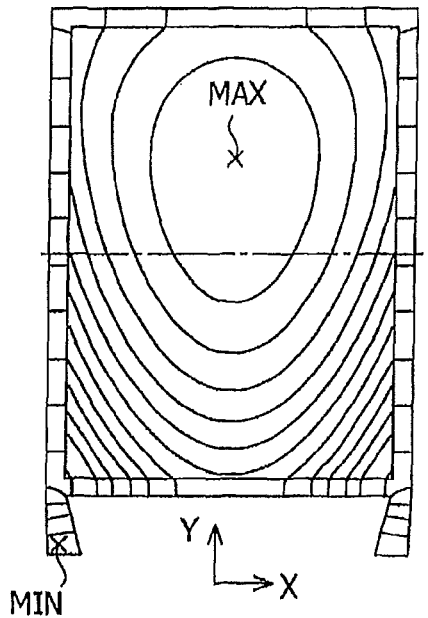
FIG. 9(a) shows simulation results for the potential distribution during full-surface lighting when using a conventional power supply bus.
Figure 9B:
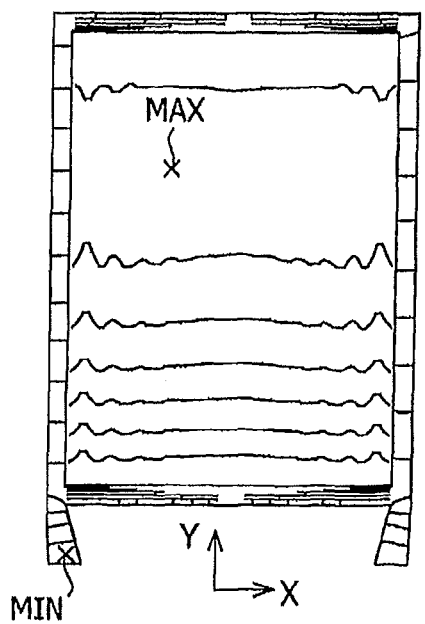
FIG. 9(b) shows simulation results for the potential distribution (for a case of six divisions+fine adjustment between slits) during full-surface lighting when using a power supply bus of this invention.
Figure 10:
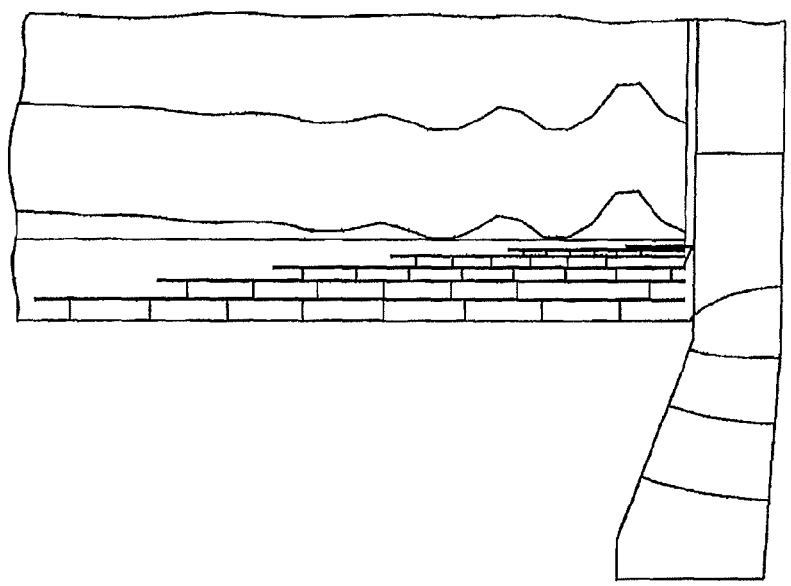
FIG. 10 is an enlarged diagram of simulation results for the potential distribution of a portion in the vicinity of a slit of the power supply bus shown in FIG. 9(b)
Figure 11:
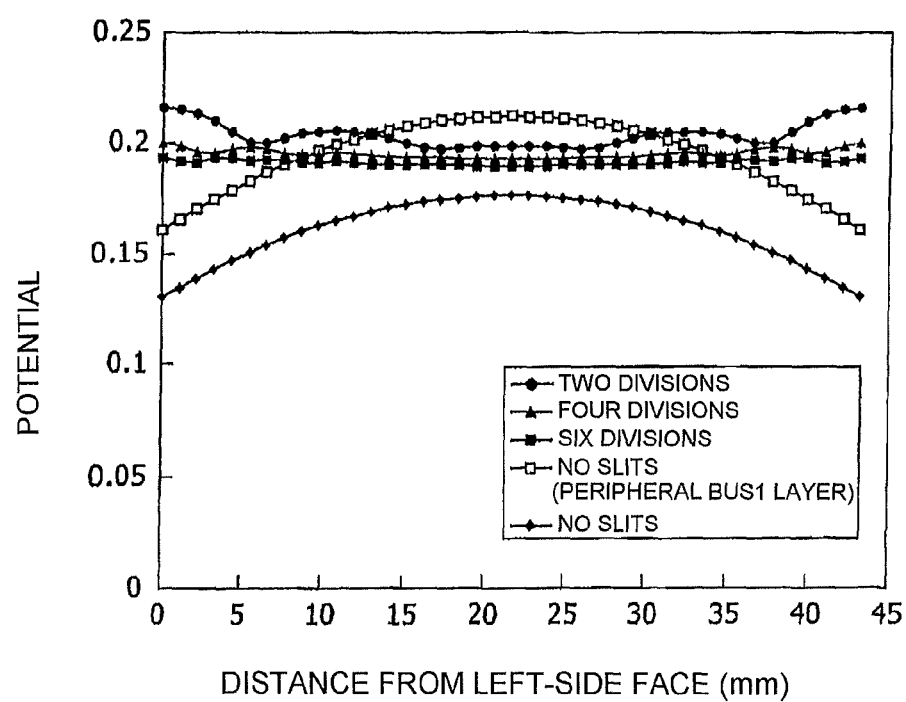
FIG. 11 shows the relation between the number of divisions of a power supply bus and the potential distribution in the screen center x direction.

First, design studies of the power supply bus were performed using previous simulations such as shown in FIG. 9, and ultimately a pattern was adopted having, in four places, a structure portion divided into six by slits, such as that shown in FIG. 8. In essence there is lateral symmetry, and so 60 power supply lines, which are ⅙ of the 120×RGB=360 power supply lines of half the screen, were taken to be one block, and the power supply bus was divided into slits in proportion to the distance from the power supply terminal to each of the blocks. The slit width was 10 μm, which was very small compared with the total width of the power supply bus. Further, the simulations of FIG. 9(b) were repeated, and the slit positions, that is, the divided bus widths, were adjusted such that the potentials at the power supply line connection portions during full-surface lighting were as uniform as possible. FIG. 10 is an enlarged diagram of the simulation results for the potential distribution (0.01 V intervals) of portions near slits in the power supply bus shown in FIG. 9(b).

Here, in FIG. 9(a) a potential distribution (that is, two-dimensional potential distribution) is shown in which the maximum potential, denoted by the symbol "MAX", is positioned near the center of the screen, and the potential gradually declines in moving toward the periphery, with the minimum potential, denoted by the symbol "MIN", is positioned near a power supply terminal. On the other hand, in FIG. 9(b) a one-dimensional potential distribution is shown in which the positions of the maximum potential and minimum potential, denoted by the symbol "MAX" and the symbol "MIN", are not much changed from those in FIG. 9(a), but the potential difference is reduced in the lateral direction of the screen.

In manufacture of the TFT circuit substrate, first a 400 nm MoCr film was sputter-deposited onto 200 mm.times.200 mm.times.0.7 mm thick alkali-free glass (AN-100, manufactured by Asahi Glass Co., Ltd.), and a photolithography method was used to form a portion of a power supply bus pattern and a prescribed TFT pattern, as shown in FIG. 8(a). After forming an insulating film and amorphous Si layer on this, a second-layer MoCr film was sputter-deposited to a thickness of 300 nm, and a photolithography method was used to form a pattern. The second-layer MoCr film formed power supply lines connecting each of the 320 pixels in the vertical direction while connecting to the power supply bus at both ends, and was also used as signal lines crossing over the power supply bus. However, there existed space not used as signal lines, and so the power supply bus had a partially layered structure in the positions indicated by the numeral 62 in FIG. 6. The MoCr layers layered above and below were connected by a plurality of contact holes opened in advance in the insulating film by dry etching. On this was deposited a passivation film (SiN, thickness 300 nm) using a CVD system, and dry etching was used to form openings for connection to organic EL elements and terminal openings. Next, a planarization resin layer 40 of thickness approximately 2 μm was formed using a photolithography method, to alleviate wiring steps. Further, holes with gentle taper angles were formed in the connection portions of TFTs and organic EL elements. After photoprocesses, baking was performed for one hour at approximately 220° C. to remove water from the planarization layer. That is, the processes were unchanged from those used for manufacture of ordinary amorphous Si TFT circuit substrates.

Next, organic EL elements were formed. First an $SiO_2$ passivation film of thickness 300 nm was sputter-deposited on a TFT circuit substrate, and dry etching was used to provide openings in contact hole portions and terminal portions. Next, in order to improve closeness of contact, IZO was sputter-deposited to a thickness of 50 nm as an underlayer 41. The sputtering system was an RF planar magnetron system, and Ar gas was used. This layer was connected to the TFTs by contact holes provided in the planarization layer and passivation layer. Next, an Ag alloy was sputter-deposited to a thickness of 100 nm on this IZO layer, and after applying an "OFRP-800" resist (product name, manufactured by Tokyo Ohka Kogyo Co., Ltd.), exposure and development were performed, followed by wet etching, to form a reflective electrode 42 divided into island shapes for each subpixel. Onto this was deposited IZO to a thickness of 30 nm, and a similar process was used to form an island-shape pattern so as to cover the Ag alloy reflective electrode. At this time, the above-described underlayer was simultaneously patterned, and separated into individual electrodes. Next, on the island-shape reflective electrode 42 covered by IZO, a novolac system resin film ("JEM-700R2", manufactured by JSR Corp.) was applied by spin-coating to a thickness of 1 μm, and a photolithography method was used to open windows at sites for emission (display portion) to form an organic insulating film 43.

Next, after mounting in a resistive-heating vacuum evaporation system, 1.5 nm of Li was deposited onto the reflective electrode, to obtain a cathode buffer layer. Then, an electron transport layer, emission layer, hole transport layer, and hole injection layer were deposited in order, without breaking the vacuum, to form an organic EL layer 44. In film deposition, the chamber internal pressure was reduced to $1 \times 10^{-4}$ Pa. The respective layers were deposited at an evaporation deposition rate of 0.1 nm/s; as the electron transport layer, tris(8-hydroxyquinolinato)aluminum (Alq3) with film thickness 20 nm, as the emission layer 4,4'-bis(2,2'-diphenylvinyl)biphenyl (DPVBi) with film thickness 30 nm, as the hole transport layer 4,4'-bis[N-(1-naphthyl)-N-phenylamino]biphenyl (α-NPD) with film thickness 10 nm, and as the hole injection layer copper phthalocyanine (CuPC) with film thickness 100 nm, were used. On this, MgAg was evaporation-deposited to a thickness of 5 nm, for use as a damage mitigation layer during sputter deposition of a transparent electrode. This was moved into a facing-sputtering system without breaking the vacuum, and IZO was deposited to a thickness of 200 nm as a transparent electrode 45. During evaporation deposition and sputter deposition of these films, a metal mask with the shape of a square window opened in the position corresponding to the display portion was used. The substrate was then moved to a CVD system without breaking the vacuum, and SiN was deposited to a thickness of 2 μm over the entire surface as the barrier layer 46.

On the other hand, to manufacture a color filter substrate, first a photolithography method was used to form a black matrix 47 (CK-7001, manufactured by Fuji Film Arch Co., Ltd.) to a thickness of 1 μm on 200 mm×200 mm×0.7 mm thick alkali-free glass (Eagle 2000, manufactured by Corning Inc.). Next, a photolithography method was used to form color filters 48 of red (CR-7001, manufactured by Fuji Film Arch Co., Ltd.), green (CG-7001, manufactured by Fuji Film Arch Co., Ltd.), and blue (CB-7001, manufactured by Fuji Film Arch Co., Ltd.). All had rectangular shapes and were of thickness approximately 1.5 μm. Next, a photosensitive resin (CR-600, manufactured by Hitachi Chemical Co., Ltd.) was used with a photolithography method to form a bank structure on the black matrix, with rectangular-shape barrier walls 39 extending in the same direction as the rectangles of the color filters. The bank barrier walls had a width of approximately 14 μm and a height of approximately 5 μm. Onto this the same photosensitive resin was again applied, and a photolithography method was used to form spacers. The spacers had a diameter of approximately 15 μm and height of approximately 2 μm, and were in positions hidden by the black matrix.

Next, after heating and drying this color filter substrate, the substrate was set in a multi-nozzle type inkjet apparatus (impact precision approximately ±5 μm) which has been set in an environment of 50 ppm oxygen, 50 ppm or less nitrogen, and after alignment using markers formed by the black matrix, red and green color conversion materials dissolved in a solvent were applied over the entire screen aiming at the bank center portions of pixels corresponding to the respective colors while scanning, and then were dried at a temperature of 100° C. without breaking the nitrogen atmosphere. (Description of the color conversion materials is omitted.)

In this way, the TFT circuit substrate and color filter substrate including a plurality of screens were manufactured.

Next, the organic EL substrate and color filter substrate were moved into a bonding apparatus held in an environment of 5 ppm oxygen, 5 ppm or less water content. And, the process surface of the color filter substrate was set face-up, and a dispenser was used to seamlessly apply an epoxy-system ultraviolet-hardening adhesive (XNR-5516, manufactured by Nagase ChemteX Corp.) onto the outer peripheries of a plurality of screens, to form a so-called bank, after which a thermosetting epoxy adhesive of lower viscosity was dropped near the center of each screen. The device used for dropping was a rotation-type mechanical measurement valve with a dispensing precision of within 5%.

Then, the process surface of the TFT circuit substrate with the organic EL elements formed was set face-downward, and with the color filter substrate and the process surface facing each other, the pressure was reduced to approximately 10 Pa, and the two substrates were brought into close proximity in parallel at a distance of approximately 30 μm, and with the entire perimeter of the peripheral seal material in contact with the organic EL substrate, an alignment mechanism was used to align the pixel positions of the two substrates, after which the pressure was returned to atmospheric pressure and a slight load was applied. The dropped thermosetting epoxy adhesive spread to the panel peripheral portions, and stopped where the tips of spacers of the color filter substrate made contact with the TFT circuit substrate with organic EL elements. Then, only the peripheral seal portion was irradiated from the color filter substrate side with ultraviolet rays through a mask and temporarily hardened, and the substrates were retrieved into the ordinary environment.

Figure 1:
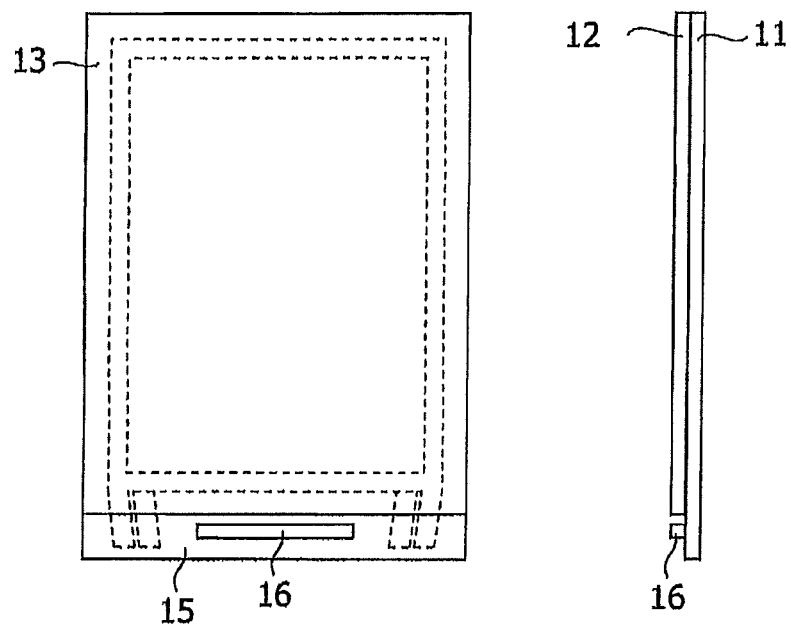
FIG. 1 is an overall diagram of a general top-emission type organic EL panel unit.

Thereafter, an automatic glass scriber and breaking apparatus was used for division into individual panels (in this stage there were no ICs). These were inserted into a heating furnace and heated for one hour at 80° C., and after natural cooling for 30 minutes in the furnace, were removed. These were inserted into a dry etching apparatus, and the barrier layer of thickness 2 μm covering pads for connection of terminal portions 15 and ICs was removed. Finally, control ICs were COG-connected, and panel units such as that of FIG. 1 were completed.

Next, the panel units were connected to a power supply, and a general-purpose brightness meter was used to evaluate the brightness distribution. In conventional panels, which are substantially the same as these panels except for the slit portions, the brightness unevenness during full-surface lighting was approximately 20 to 40% (as indicated by current values). And, panels having power supply buses with a slit structure of this invention had brightness unevenness reduced to approximately 10 to 20%, so that unevenness was not very noticeable. Further, the brightness distribution was a one-dimensional distribution, in only the vertical direction in FIG. 1. Even in this state there were no problems for practical use, but upon further connecting an image controller and setting coefficients to correct the one-dimensional brightness distribution obtained in the simulation of FIG. 9(b) to be flat, the brightness unevenness was reduced to approximately 5 to 10% or less, and was practically undiscernible. The remainder was due to simulation error and individual differences, and so to perform further correction, correction coefficients can be adjusted according to the results of brightness unevenness measurements for individual panels; but this is not necessary given the actual results.

Example 2

Next, an example of a manufacturing process for the structure of FIG. 12 through FIG. 16 is described. The pixel dimensions of the panel are 60 μm×180 μm×RGB, the number of pixels is 240 RGB horizontal×320 vertical QVGA, the screen size is approximately 3 inches, the power supply bus allowed width is approximately 2 mm, and power supply terminals are drawn out at two places.

Within the screen, 240×3 power supply lines of width approximately 8 μm are arranged, linearly connecting all of the 320 vertical pixels, and are connected at both ends to the power supply bus. And, within each pixel, wires of width approximately 3 μm to 5 μm form transistor and other circuit patterns. Control of each pixel is effected by connection to a control IC and signal line placed outside the screen.

Next, details of connection lines 63 between power supply lines were designed so as to make connections from one end of the screen to the other end, as with the connection lines 74 of FIG. 13(a) and the connection lines 59 of FIG. 14. Connections to the power supply bus were not made in the direction of extension of the connection lines 63. The vertical-direction interval of arrangement of connection lines 74 was every pixel. However, in order to suppress parasitic capacitances, intersection portions with data signal lines 25 were made extremely narrow. Further, in order to effectively utilize the space within pixels, a wire structure was employed which passed underneath the contact hole portions 27 of the planarizing resin layer, where a circuit pattern is not normally placed. Of course, where wires intersected, a design was used which interposed an insulating film.

Next, in design studies of the power supply bus, a pattern was adopted having, in four places, a structure portion divided into six by slits, as shown in FIG. 13(a). In essence there is lateral symmetry, and so 60 power supply lines, which are ⅙ of the 120×RGB=360 power supply lines of half the screen, were taken to be one block, and the bus width after dividing into slits was adjusted in proportion to the distance from the power supply terminal to each of the blocks. The slit width was 10 μm, which was very small compared with the total width of approximately 2 mm of the power supply bus.

In manufacture of the TFT circuit substrate, first a 400 nm MoCr film was sputter-deposited onto 200 mm×200 mm×0.7 nm thick alkali-free glass (AN-100, manufactured by Asahi Glass Co., Ltd.), and a photolithography method was used to form a prescribed metal pattern of a first layer including the power supply bus pattern of FIG. 8(a) and connection lines 59 of power supply lines. After forming an inorganic insulating film and amorphous Si layer on this, a second-layer MoCr film was sputter-deposited to a thickness of 300 nm, and a photolithography method was used to form a pattern. The second-layer MoCr film formed power supply lines 21 connecting each of the 320 pixels in the vertical direction while connecting to the power supply bus at both ends, and was also used as signal lines (25, 26) crossing over the power supply bus, formed from the first layer metal. However, there existed space not used as signal lines, and so the power supply bus had multilayer wiring portions 62 in portions, as shown in FIG. 12. The MoCr layers layered above and below were connected by a plurality of contact holes opened in advance in the insulating film by dry etching.

After formation of the second-layer MoCr film, a passivation film (SiN, thickness 300 nm) was deposited using a CVD system, and dry etching was used to form openings for connection to organic EL elements and terminal openings. Next, a planarization resin layer of thickness approximately 2 μm was formed using a photolithography method, to alleviate wiring steps. At this time, contact holes 27 with gentle taper angles were formed in the connection portions of TFTs and organic EL elements. After photoprocesses, the TFT circuit substrate was baked for one hour at approximately 220° C. to remove water from the planarization layer. That is, the processes were unchanged from those used for manufacture of ordinary amorphous Si TFT circuit substrates.

Subsequent manufacturing processes (that is, from formation of organic EL elements to manufacture of panel units) were similar to those in Example 1.

The brightness distribution of manufactured panels was evaluated. In conventional panels, there was a concentration of brightness in the vicinity of terminals, and brightness unevenness during full-screen lighting was approximately 20 to 40% over the entire screen (as indicated by current values). On the other hand, similarly to Example 1, in panels having a structure in which slits were inserted into the power supply bus as in this application, the brightness distribution was one-dimensional, and the brightness unevenness could be reduced to approximately 10 to 20%.

However, in Example 1, with the total current made the same during full-surface lighting, if for example the current ratio is set to blue 0.5:green 1:red 1.5 in order to display white and black or another specific color, compared with a case in which the current ratio is set to blue 1:green 1:red 1, the red-component brightness unevenness increases to approximately 1.5-fold, the blue-component brightness evenness is approximately 0.5-fold, and moreover there are cases in which, if the power supply voltage is raised to the extent of the rise in the red GND potential to secure adequate current, the overall power consumption increases. On the other hand, upon adopting a structure as in this example in which slits are formed in the power supply bus and connection lines are used to connect together power supply lines, even at settings at which the current balance is different as described above, there was no increase in brightness unevenness during full-surface lighting, and moreover the brightness unevenness was about the same for all colors. Hence even when performing software correction for brightness unevenness, there was no need to perform correction by color, and correction was made simple. Further, the increase in power consumption of the TFT circuit substrate was slight.

Further, because potentials were about the same among power supply lines as a result of adding connection lines, when displaying a pattern in which only pixels in the peripheral portion of the screen are lit (hereafter called a "black-on-white pattern"), there was no occurrence whatsoever of a brightness distribution in which a portion of the pattern was dark (normally called a "shadow" or "ghosting"). When displaying a pattern in which only pixels in the center portion of the screen are lit (a white-on-black pattern), there existed a slight brightness distribution which was brighter near non-emitting portions. However, this brightness distribution was reduced by averaging the voltage drops themselves in power supply lines, and numerous connection lines for power supply lines were also present to lower the resistance, so that the effect could not be discerned with the naked eye and did not pose a practical problem.

Example 3

Panel units having a structure including the bypass line paths of the invention described in "Preferred Embodiment 3" above (see FIG. 18) were manufactured, similarly to Examples 1 and 2. By including these bypass line paths, the power supply line resistance could be decreased by approximately 30%, so that brightness unevenness during full-surface lighting was reduced to 15% or lower under the same conditions. Further, even for settings at which the red-green-blue (RGB) current balance was greatly different, there was no difference in brightness unevenness from a case in which uniform currents were passed in each of the RGB power supply lines, and corrections by color were not necessary. Also, there was almost no increase in power consumption.

Further, there was no occurrence at all of shadows during display of black-on-white patterns. In the case of white-on-black patterns, there was the possibility of a brightness distribution with more brightness on the non-emitting portion side. However, such brightness distribution was reduced by averaging of voltage drops themselves in power supply lines and through bypasses, and numerous connection lines for power supply lines were also present to lower the resistance, so that the effect could not be discerned with the naked eye and did not pose a practical problem.

Example 4

Panel units having a structure including the bypass line paths of the invention described in "Preferred Embodiment 4" above (see FIG. 20) were manufactured, similarly to Examples 1 and 2. By including these bypass line paths, the power supply line resistance could be decreased by approximately 30%, so that brightness unevenness during full-surface lighting was reduced to 15% or lower under the same conditions. Further, even for settings at which the red-green-blue (RGB) current balance was greatly different, there was not much difference in brightness unevenness from a case in which uniform currents were passed in each of the RGB power supply lines, and corrections by color were not necessary. Also, there was almost no increase in power consumption.

Further, there was slight occurrence of shadows or ghosting during display of black-on-white patterns, but this was reduced by averaging of voltage drops themselves in power supply lines and through bypass line paths, and so did not pose a practical problem. No brightness unevenness in white-on-black patterns occurred at all in the direction of connection lines of power supply lines.

INDUSTRIAL APPLICABILITY

This invention can be used in thin-type displays such as organic EL displays and liquid crystal panels, and in the circuit substrates thereof.

The invention claimed is:

1. A surface-emitting display device, comprising:
a plurality of power supply lines each having two ends;
a plurality of pixel circuits, each connected to a corresponding one of the plurality of power supply lines; and
a power supply bus electrically connected to a power supply terminal and the two ends of each of the plurality of power supply lines, so as to conduct current from the power supply terminal to the plurality of power supply lines, the power supply bus having
a plurality of slits that are formed on a portion of the power supply bus perpendicular to the power supply lines, thereby dividing the power supply bus into a plurality of portions, a number of the slits and widths and lengths of the portions of the power supply bus determining potentials of the ends of the plurality of power supply lines, and
a first cutout portion and a second cutout portion that are positioned next to each other to form an L-shape cutout, the first cutout portion being formed between the plurality of power supply lines and the plurality of slits, the second cutout portion being substantially perpendicular to the first cutout portion and connecting the first cutout portion to an outside of the power supply bus, to thereby form first and second edges on the power supply bus, the second cutout portion being so positioned that all of the plurality of power supply lines being on a same side of the first edge, wherein
at least two of the plurality of slits have a closed perimeter within the power supply bus,
of any two of the at least two slits having the closed perimeter, the one farther from the power supply lines has a greater length, and
the plurality of slits each have an end that is aligned with the second edge of the power supply bus.

2. The surface-emitting display device according to claim 1, wherein
the plurality of pixel circuits include a plurality of first-direction pixel circuits that are arranged in a first direction substantially perpendicular to a direction along which the plurality of power supply lines extend, and
the surface-emitting display device further includes a control circuit configured to correct current to be supplied to each of the plurality of first-direction pixel circuits according to a distance between a connection portion of said each first-direction pixel circuit to its corresponding power supply line and one end of the corresponding power supply line.

3. The surface-emitting display device according to claim 1, wherein
each of the plurality of slits is independent from the other ones of the slits.

4. The surface-emitting display device according to claim 1, wherein the power supply bus has at least one multilayer wiring portion.

5. The surface-emitting display device according to claim 1, wherein each of the pixel circuits includes an organic EL element.

6. The surface-emitting display device according to claim 5, wherein the pixel circuits drive the organic EL elements and cause emission of the organic EL elements.

7. The surface-emitting display device according to claim 1, wherein
at least one of the plurality of slits includes a third cutout portion and a fourth cutout portion that are positioned next to each other to form another L-shape cutout, the third cutout portion being parallel to the power supply lines, and the fourth cutout portion being substantially perpendicular to the third cutout portion.

8. The surface-emitting display device according to claim 1, wherein the L-shaped cutout is formed on the portion of the power supply bus perpendicular to the power supply lines, and at a position where said portion abuts another portion of the power supply bus parallel to the power supply lines.

9. A method of adjusting unevenness of brightness in a surface-emitting display device, comprising:
providing a plurality of power supply lines, each power supply line having two ends;
providing a plurality of pixel circuits, each connected to a corresponding one of the plurality of power supply lines, the plurality of pixel circuits including a plurality of first-direction pixel circuits that are arranged in a first direction substantially perpendicular to a direction along which the plurality of power supply lines extend;
providing a power supply bus, and electrically connecting the power supply bus to a power supply terminal and the two ends of each of the plurality of power supply lines, so as to conduct current from the power supply terminal to the plurality of power supply lines, the power supply bus having
a plurality of slits that are formed on a portion of the power supply bus perpendicular to the power supply lines, thereby dividing the power supply bus into a plurality of portions, a number of the slits and widths and lengths of the portions of the power supply bus determining potentials of the ends of the plurality of power supply lines, and
a first cutout portion and a second cutout portion that are positioned next to each other to form an L-shape cutout, the first cutout portion being formed between the plurality of power supply lines and the plurality of slits, the second cutout portion being substantially perpendicular to the first cutout portion and connecting the first cutout portion to an outside of the power supply bus, to thereby form first and second edges on the power supply bus, the second cutout portion being so positioned that all of the plurality of power supply lines being on a same side of the first edge, the plurality of slits each having an end that is aligned with the second edge of the power supply bus; and
with a control circuit, correcting current to be supplied to each of a plurality of first-direction pixel circuits according to a distance between a connection portion of said each first-direction pixel circuit to its corresponding power supply line and one end of the corresponding power supply line.

10. The method of adjusting brightness unevenness in a surface-emitting display device according to claim 9, wherein the control circuit corrects the current using a correction coefficient corresponding to the distance.

11. The method of claim 9, wherein at least one of the plurality of slits has a closed perimeter within the power supply bus.

12. A surface-emitting display device, comprising:
a plurality of power supply lines each having two ends;
a plurality of pixel circuits, each connected to a corresponding one of the plurality of power supply lines;
a connection line connecting an adjacent pair of the plurality of power supply lines; and
a power supply bus electrically connected to a power supply terminal and the two ends of each of the plurality of power supply lines, so as to conduct current from the power supply terminal to the plurality of power supply lines, the power supply bus having
a plurality of slits that are formed on a portion of the power supply bus perpendicular to the power supply lines, and
a first cutout portion and a second cutout portion that are positioned next to each other to form an L-shape cutout, the first cutout portion being formed between the plurality of power supply lines and the plurality of slits, the second cutout portion being substantially perpendicular to the first cutout portion and connecting the first cutout portion to an outside of the power supply bus, to thereby form first and second edges on the power supply bus, the second cutout portion being so positioned that all of the plurality of power supply lines being on a same side of the first edge, wherein
at least two of the plurality of slits have a closed perimeter within the power supply bus,
of any two of the at least two slits having the closed perimeter, the one farther from the power supply lines has a greater length, and
the plurality of slits each have an end that is aligned with the second edge of the power supply bus.

13. The surface-emitting display device according to claim 12, wherein the connection line interconnects a first set of the power supply lines, which are allocated to ones of the pixel circuits in a pixel column, and is separated from a second set of the power supply lines, which are allocated to ones of the pixel circuits in another pixel column.

14. The surface-emitting display device according to claim 13, wherein the first set of the power supply lines and the second set of the power supply lines include power supply lines connected to a subpixel column.

15. The surface-emitting display device according to claim 12, wherein each of the plurality of pixel circuits includes a portion of wiring forming a thin film transistor, thereby forming a bypass line path for the power supply line.

16. The surface-emitting display device according to claim 15, wherein a portion of the bypass line path and a portion of the connection line are formed of common wiring.

17. The surface-emitting display device according to claim 12, wherein the connection line is not connected to the power supply bus in a direction along which the connection line extends.

* * * * *